(12) United States Patent
Youn et al.

(10) Patent No.: US 11,839,108 B2
(45) Date of Patent: Dec. 5, 2023

(54) TRANSPARENT DISPLAY DEVICE

(71) Applicant: LG DISPLAY CO., LTD., Seoul (KR)

(72) Inventors: Jun-Ho Youn, Paju-si (KR); Heume-Il Baek, Paju-si (KR); In-Sun Yoo, Paju-si (KR); Sang-Bin Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 224 days.

(21) Appl. No.: 17/513,590

(22) Filed: Oct. 28, 2021

(65) Prior Publication Data
US 2022/0208865 A1 Jun. 30, 2022

(30) Foreign Application Priority Data
Dec. 28, 2020 (KR) ........................ 10-2020-0184998

(51) Int. Cl.
| | |
|---|---|
| *H01L 27/14* | (2006.01) |
| *H10K 59/121* | (2023.01) |
| *H10K 50/824* | (2023.01) |
| *H10K 59/122* | (2023.01) |
| *H10K 59/35* | (2023.01) |
| *H10K 71/12* | (2023.01) |
| *H10K 102/00* | (2023.01) |

(52) U.S. Cl.
CPC ......... *H10K 59/121* (2023.02); *H10K 50/824* (2023.02); *H10K 59/122* (2023.02); *H10K 59/352* (2023.02); *H10K 71/12* (2023.02); *H10K 2102/3026* (2023.02)

(58) Field of Classification Search
CPC .. H10K 59/121; H10K 59/122; H10K 59/352; H10K 50/824
USPC ................................................. 257/72
See application file for complete search history.

(56) References Cited

U.S. PATENT DOCUMENTS

| | | | |
|---|---|---|---|
| 2016/0035807 A1 | 2/2016 | Shi et al. | |
| 2016/0141339 A1 | 5/2016 | Prushinskiy et al. | |
| 2017/0053972 A1* | 2/2017 | Kim | .......... H10K 59/121 |
| 2017/0287994 A1 | 10/2017 | Senda et al. | |

FOREIGN PATENT DOCUMENTS

| | | | | |
|---|---|---|---|---|
| CN | 105633297 A | * | 6/2016 | ............. H01L 27/32 |
| JP | 2011-186427 A | | 9/2011 | |
| JP | 2017-199675 A | | 11/2017 | |

(Continued)

*Primary Examiner* — Phuc T Dang
(74) *Attorney, Agent, or Firm* — Birch, Stewart, Kolasch & Birch, LLP

(57) ABSTRACT

A transparent display device includes a substrate on which a pixel including first, second, and third emission areas and first and second transparent areas arranged along a first direction is defined, a light-emitting diode disposed in each of the first, second, and third emission areas and including a first electrode, a light-emitting layer, and a second electrode, and an auxiliary electrode extending in a second direction perpendicular to the first direction and electrically connected to the second electrode. The first emission area and the auxiliary electrode are disposed between the first transparent area and the second transparent area, and the second transparent area includes a first portion between the first emission area and the second emission area. Further, the first transparent area has a higher transmittance than the second transparent area.

15 Claims, 11 Drawing Sheets

(56) References Cited

FOREIGN PATENT DOCUMENTS

| JP | 2018-189937 A | 11/2018 |
| JP | 2019-121801 A | 7/2019 |
| JP | 2019-153569 A | 9/2019 |
| JP | 2020-95961 A | 6/2020 |
| KR | 10-2018-0077855 A | 7/2018 |

* cited by examiner

TRANSPARENT DISPLAY DEVICE

CROSS-REFERENCE TO RELATED APPLICATIONS

The present application claims priority under 35 U.S.C § 119(a) to Korean Patent Application No. 10-2020-0184998 filed in the Republic of Korea on Dec. 28, 2020, the entire contents of which are hereby expressly incorporated by reference in its entirety into the present application.

BACKGROUND OF THE DISCLOSURE

Field of the Disclosure

The present disclosure relates to a display device, and more particularly, to a transparent display device having an emission area and a transparent area.

Discussion of the Related Art

As one of flat panel display devices, an electroluminescent display device has wide viewing angles as compared with a liquid crystal display device because it is self-luminous and also has advantages of a thin thickness, light weight and low power consumption since a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids. Further, the electroluminescent display device can be manufactured at low costs.

Recently, a transparent display device using an electroluminescent display device has been widely developed. The transparent display device is a display device in which backgrounds or other set information behind a screen are visible. Therefore, image information and the surrounding environment can be displayed together.

The transparent display device using an electroluminescent display device can include a plurality of pixels, each of which has a plurality of emission areas. By selectively driving the plurality of emission areas, various color images are displayed.

In the transparent display device, light-emitting layers are provided in the respective emission areas, and each light-emitting layer is formed through a vacuum thermal evaporation process in which a luminescent material is selectively deposited using a fine metal mask (FMM).

However, in the transparent display device using the electroluminescent display device, since the size of the emission area is relatively small, it may not be easy to form the light-emitting layer through the evaporation process.

In addition, the evaporation process can increase manufacturing costs due to the preparation of the mask and can present a limitation in application to a large-sized and high-definition display device due to manufacturing variations, sagging, shadow effect of the mask, and the like.

SUMMARY OF THE DISCLOSURE

Accordingly, the present disclosure is directed to a transparent display device that substantially obviates one or more of the problems due to limitations and disadvantages of the related art.

An object of the present disclosure is to provide a transparent display device having a large size and high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the disclosure.

To achieve these and other advantages and in accordance with the purpose of the present disclosure, as embodied and broadly described herein, there is provided a transparent display device that includes a substrate on which a pixel including first, second, and third emission areas and first and second transparent areas arranged along a first direction is defined, a light-emitting diode provided in each of the first, second, and third emission areas and including a first electrode, a light-emitting layer, and a second electrode, and an auxiliary electrode extending in a second direction perpendicular to the first direction and electrically connected to the second electrode, wherein the first emission area and the auxiliary electrode are disposed between the first transparent area and the second transparent area, and the second transparent area includes a first portion between the first emission area and the second emission area, and wherein the first transparent area has a higher transmittance than the second transparent area.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure.

DETAILED DESCRIPTION OF THE EMBODIMENTS

Reference will now be made in detail to exemplary embodiments of the disclosure, examples of which are illustrated in the accompanying drawings.

A transparent display device according to an embodiment of the present disclosure displays an image using an electroluminescent display device. The transparent display device using an electroluminescent display device includes a plurality of pixels to display an image, and each of the plurality of pixels can include a plurality of sub-pixels such as first, second, and third sub-pixels. The first, second, and third sub-pixels can have a configuration shown in FIG. 1 as one example. Further, all the components of each transparent display device according to all embodiments of the present disclosure are operatively coupled and configured.

Figure 1:
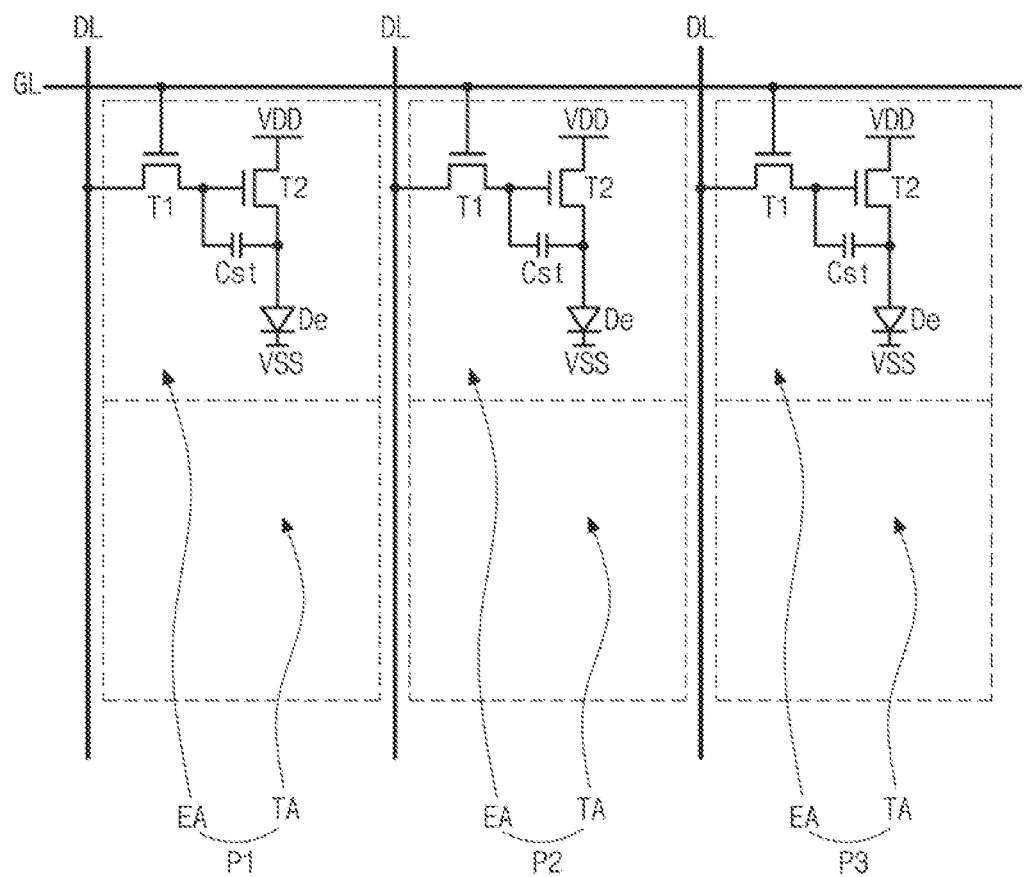
FIG. 1 is a circuit diagram of one pixel of a transparent display device according to an embodiment of the present disclosure.

FIG. 1 is a circuit diagram of one pixel of a transparent display device according to an embodiment of the present disclosure.

In FIG. 1, the transparent display device according to the embodiment of the present disclosure includes a plurality of gate lines and a plurality of data lines crossing each other to define sub-pixels. Particularly, in the example of FIG. 1, a gate line GL and data lines DL cross each other to define first, second, and third sub-pixels P1, P2, and P3. Each of the first, second, and third sub-pixels P1, P2, and P3 includes an emission area EA and a transparent area TA. Accordingly, one pixel can include three emission areas EA and three transparent areas TA.

Alternatively, the transparent areas TA of the first, second, and third sub-pixels P1, P2, and P3 can be connected to each other and provided as one body. For example, one pixel can include three emission areas EA and one transparent area TA, but is not limited thereto. For example, the first, second, and third sub-pixels P1, P2, and P3 can be red, green, and blue sub-pixels, respectively. Other variations are possible.

The transparent display device according to the embodiment of the present disclosure shows together the surrounding environment information such as backgrounds through the transparent areas TA while displaying image information through the emission areas EA.

A switching thin film transistor T1, a driving thin film transistor T2, a storage capacitor Cst, and a light-emitting diode De are formed in the emission area EA of each of the first, second, and third sub-pixels P1, P2, and P3.

More specifically, the gate line GL extends in a first direction (e.g., horizontal direction), and the data lines DL extend in a second direction (e.g., vertical direction), where the first and second directions can be perpendicular to each other. The first, second, and third sub-pixels P1, P2, and P3 are sequentially arranged along the horizontal direction. The emission area EA and the transparent area TA of each sub-pixel P1, P2, and P3 can be arranged along the vertical direction.

In the emission area EA of each sub-pixel P1, P2, and P3, a gate electrode of the switching thin film transistor T1 is connected to the gate line GL and a source electrode of the switching thin film transistor T1 is connected to the data line DL. A gate electrode of the driving thin film transistor T2 is connected to a drain electrode of the switching thin film transistor T1 and a source electrode of the driving thin film transistor T2 is connected to a high voltage supply VDD. An anode of the light-emitting diode De is connected to a drain electrode of the driving thin film transistor T2, and a cathode of the light-emitting diode De is connected to a low voltage supply VSS. The storage capacitor Cst is connected to the gate electrode and the drain electrode of the driving thin film transistor T2.

The transparent display device using an electroluminescent display device is driven to display an image. For example, when the switching thin film transistor T1 is turned on by a gate signal applied through the gate line GL, a data signal from the data line DL is applied to the gate electrode of the driving thin film transistor T2 and an electrode of the storage capacitor Cst through the switching thin film transistor T1.

When the driving thin film transistor T2 is turned on by the data signal, an electric current flowing through the light-emitting diode De is controlled, thereby displaying an image. The light-emitting diode De emits light due to the current supplied through the driving thin film transistor T2 from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the first, second, and third sub-pixels P1, P2, and P3 show different gray levels depending on the magnitude of the data signal, and as a result, the transparent display device displays an image.

In addition, the storage capacitor Cst maintains charges corresponding to the data signal for a frame when the switching thin film transistor T1 is turned off. Accordingly, even if the switching thin film transistor T1 is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in each sub-pixel P1, P2, and P3 in addition to the switching and driving thin film transistors T1 and T2 and the storage capacitor Cst.

For example, in the transparent display device using an electroluminescent display device, the driving thin film transistor T2 is turned on for a relatively long time while the data signal is applied to the gate electrode of the driving thin film transistor T2 and the light-emitting diode De emits light to thereby display the gray level. The driving thin film transistor T2 can deteriorate due to application of the data signal for a long time. Therefore, the mobility and/or threshold voltage Vth of the driving thin film transistor T2 are changed, and thus the each sub-pixel P1, P2, and P3 displays a different gray level with respect to the same data signal. This can cause non-uniform luminance, which can lower the image quality of the display device.

Accordingly, to compensate for the change of the mobility and/or threshold voltage of the driving thin film transistor T2, at least one sensing thin film transistor and/or capacitor for sensing a voltage change can be further added in each sub-pixel P1, P2, and P3. The sensing thin film transistor and/or capacitor can be connected to a reference line for applying a reference voltage and outputting a sensing voltage.

The transparent display device can be classified into a bottom emission type and a top emission type according to an emission direction of the electroluminescent display device used therefor. In the bottom emission type display device, light from the light-emitting diode De is output toward a substrate on which the thin film transistors T1 and T2 are formed through the anode, and in the top emission type display device, light from the light-emitting diode De is output toward a direction opposite the substrate through the cathode. In general, since the thin film transistors T1 and T2 are formed under the light-emitting diode De in the electroluminescent display device, the size of an effective emission area is limited due to the thin film transistors T1 and T2 in the bottom emission type display device, and the top emission type display device has the larger effective emission area than the bottom emission type display device. Therefore, the top emission type display device has a higher aperture ratio than the bottom emission type display device, so that the top emission type display device is widely used for a display device with a large size and high definition.

Since the cathode is mostly formed of a metal material, the cathode can be formed to a relatively thin thickness in the top emission type display device such that light is output through the cathode. Accordingly, the resistance of the cathode increases, and a VSS voltage drop can occur due to the resistance of the cathode in the display device with a large size and high definition, which can cause a limitation of non-uniform brightness. Therefore, the transparent display device according to the embodiment of the present disclosure has a structure for lowering the resistance of the cathode.

Meanwhile, the light-emitting layer of the light-emitting diode De of the present disclosure is formed through a solution process. Thus, the process can be simplified and a display device with a large size and high resolution can be provided.

By the way, as the resolution increases, the size of the pixel decreases. Therefore, the light-emitting layers of adjacent different color sub-pixels formed through the solution process can be connected to each other to thereby cause color mixing. Particularly, since the transparent display device includes the emission area and the transparent area in the pixel and the size of the emission area is relatively small, there is a high possibility of the color mixing as the resolution increases. The transparent display device of the present disclosure proposes a structure for preventing the color mixing.

Figure 2:
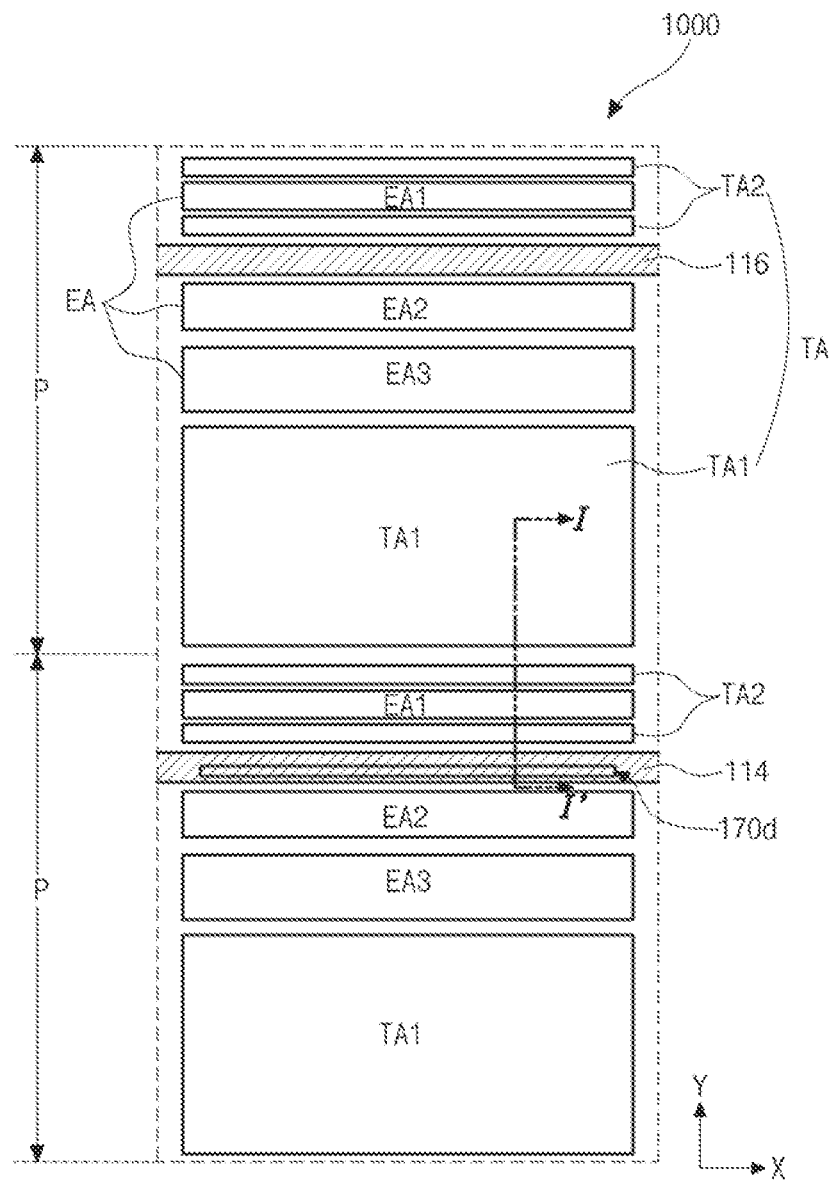
FIG. 2 is a schematic plan view of a transparent display device according to a first embodiment of the present disclosure.

FIG. 2 is a schematic plan view of a transparent display device according to a first embodiment of the present disclosure. The transparent display device of FIG. 2 includes a plurality of pixels defined by data and gate lines.

As shown in FIG. 2, in a transparent display device 1000 according to the first embodiment of the present disclosure, one or each pixel P includes an emission area EA and a transparent area TA. At this time, one pixel P can include three emission areas EA1, EA2, and EA3 and two transparent areas TA1 and TA2, and each of the emission areas EA1, EA2, and EA3 has substantially the same configuration except for the sizes.

More particularly, the pixel P includes first, second, and third sub-pixels, for example, red, green, and blue sub-pixels. The emission area EA can include first, second, and third emission areas EA1, EA2, and EA3 corresponding to the red, green, and blue sub-pixels, respectively. In addition, the transparent area TA includes first and second transparent areas TA1 and TA2, and the first and second transparent areas TA1 and TA2 have different transmittances. The transmittance of the first transparent area TA1 is higher than the transmittance of the second transparent area TA2 based on the same area.

The first, second, and third emission areas EA1, EA2, and EA3 and the first and second transparent areas TA1 and TA2 are arranged along a Y direction (e.g., vertical direction) in the context of the figure. Here, the Y direction can be defined as a first direction, and an X direction (e.g., horizontal direction) in the context of the figure can be defined as a second direction. Alternatively, the X direction can be defined as a first direction, and the Y direction can be defined as a second direction or vice versa.

The first, second, and third emission areas EA1, EA2, and EA3 and the first transparent area TA1 can be sequentially arranged along the Y direction, and the second transparent area TA2 can be disposed at both sides of the first emission area EA1. For example, the second transparent area TA2 can include a first portion disposed between the first emission area EA1 and the second emission area EA2 adjacent to each other and a second portion disposed between the first emission area EA1 and the first transparent area TA1 adjacent to each other. Here, the second portion of the second transparent area TA2 disposed between the first emission area EA1 and the first transparent area TA1 can be omitted.

The first, second, and third emission areas EA1, EA2, and EA3 can have different sizes. For example, the size of the second emission area EA2 of the green sub-pixel can be larger than the size of the first emission area EA1 of the red sub-pixel and smaller than the size of the third emission area EA3 of the blue sub-pixel, but is not limited thereto.

Since light-emitting diodes provided at respective sub-pixels are formed of light-emitting materials having different properties, the light-emitting diodes have different lifetimes and efficiencies, and the lifetime of the display device can be lowered due to the difference in the lifetimes of the light-emitting diodes. Accordingly, in the present disclosure, by differentiating the sizes of the first, second, and third emission areas EA1, EA2, and EA3 of the red, green, and blue sub-pixels, the lifetimes and efficiencies of the light-emitting diodes provided at respective sub-pixels can be optimized, thereby solving the problem of lowering the lifetime of the display device and thus improving the lifetime of the display device.

The first, second, and third emission areas EA1, EA2, and EA3 can have the same length along the X direction and different widths along the Y direction. For example, the width of the second emission area EA2 of the green sub-pixel can be greater than the width of the first emission area EA1 of the red sub-pixel and smaller than the width of the third emission area EA3 of the blue sub-pixel.

The first, second, and third emission areas EA1, EA2, and EA3 and the first and second transparent areas TA1 and TA2 each are illustrated as having a rectangular shape, but is not limited thereto. The first, second, and third emission areas EA1, EA2, and EA3 and the first and second transparent areas TA1 and TA2 each can have various shapes such as a rectangular shape with rounded corners, an oval shape, or the like.

Meanwhile, a signal line 114 and 116 is disposed between the adjacent first and second emission areas EA1 and EA2, more particularly, between the adjacent second transparent area TA2 and the second emission area EA2. The signal line 114 and 116 includes a low potential voltage line 114 for supplying a low potential voltage VSS and a high potential voltage line 116 for supplying a high potential voltage VDD. The low potential voltage line 114 and the high potential voltage line 116 extend along the X direction and alternate each other along the Y direction. Namely, the low potential voltage line 114 is disposed in one of adjacent two pixels P along the Y direction, and the high potential voltage line 116 is disposed in the other of the adjacent two pixels P. The low potential voltage line 114 and the high potential voltage line 116 can be formed of the same material and on the same layer. However, the present disclosure is not limited thereto. Alternatively, the low potential voltage line 114 and the high potential voltage line 116 can be formed of the same material and on different layers or formed of different materials and on different layers.

A contact hole 170d is formed to correspond to the low potential voltage line 114, and the low potential voltage line 114 is electrically connected to a cathode of a light-emitting diode through the contact hole 170d.

A cross-sectional structure of the transparent display device 1000 according to the first embodiment of the present disclosure will be described in detail with reference to FIG. 3.

Figure 3:
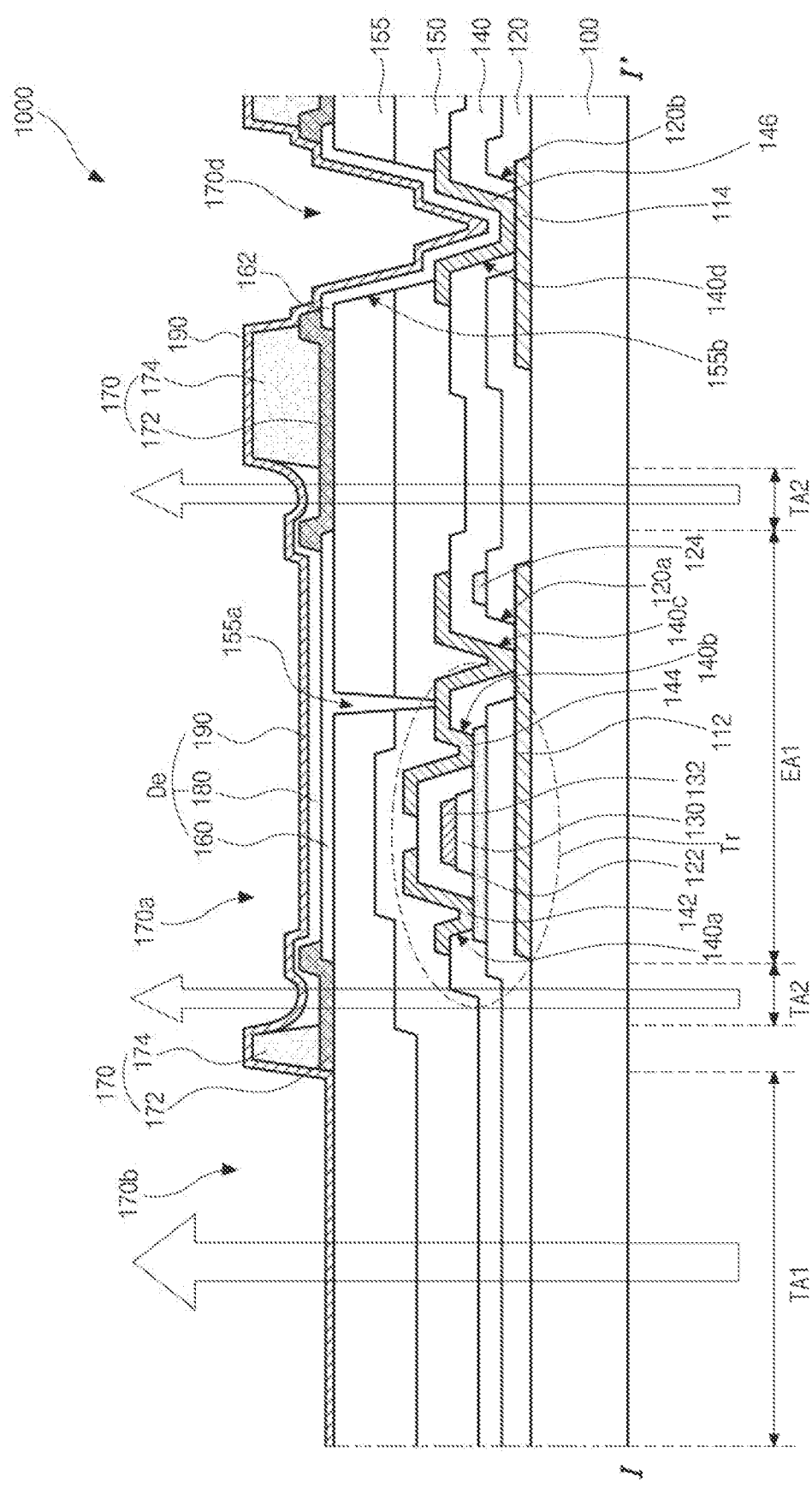
FIG. 3 is a schematic cross-sectional view of the transparent display device according to the first embodiment of the present disclosure and corresponds to the line I-I' of FIG. 2.

FIG. 3 is a schematic cross-sectional view of the transparent display device according to the first embodiment of the present disclosure and corresponds to the line I-I' of FIG. 2. It will be described with referent to FIG. 2 together.

As described above, the emission area EA includes the first, second, and third emission areas EA1, EA2, and EA3, and the transparent area TA includes the first and second transparent areas TA1 and TA2. Since the first, second and third emission areas EA1, EA2, and EA3 have substantially the same configuration, only the first emission area EA1 is shown in FIG. 3.

As shown in FIG. 3, in the transparent display device 1000 according to the first embodiment of the present disclosure, a light-blocking pattern 112 and a first auxiliary electrode 114 of a first conductive material such as metal are formed on a substrate 100 on which the pixel P including the emission areas EA1, EA2, and EA3 and the transparent areas TA1 and TA2 is defined. The light-blocking pattern 112 is disposed in each emission area EA1, EA2, and EA3, and the first auxiliary electrode 114, which is the low potential voltage line, is disposed between the first emission area EA1 and the second emission area EA2 adjacent to each other, more particularly, between the second transparent area TA2 and the second emission area EA2 adjacent to each other.

The substrate 100 can be a glass substrate or a plastic substrate. For example, polyimide can be used for the plastic substrate, but is not limited thereto.

The light-blocking pattern 112 and the first auxiliary electrode 114 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the light-blocking pattern 112 and the first auxiliary electrode 114 can have a double-layered structure including a lower layer of a molybdenum-titanium alloy (MoTi) and an upper layer of copper (Cu), and the upper layer can have a thicker thickness than the lower layer.

Meanwhile, as mentioned above, the high potential voltage line 116 is formed between the second transparent area TA2 and the second emission area EA2 adjacent to each other of another pixel P on the substrate 100 and formed of the same material as the first auxiliary electrode 114.

A buffer layer 120 is formed on the light-blocking pattern 112 and the first auxiliary electrode 114 substantially on an entire surface of the substrate 100. The buffer layer 120 can be formed of an inorganic insulating material such as silicon oxide ($SiO_2$) or silicon nitride (SiNx) and can be formed as a single layer or multi layers.

Here, the buffer layer 120 has a first hole 120a on the light-blocking pattern 112 and a second hole 120b on the first auxiliary electrode 114. A top surface of the light-blocking pattern 112 is partially exposed through the first hole 120a, and a top surface of the first auxiliary electrode 114 is partially exposed through the second hole 120b.

A semiconductor layer 122 and a capacitor electrode 124 are patterned and formed on the buffer layer 120. The semiconductor layer 122 and the capacitor electrode 124 are spaced apart from each other over the light-blocking pattern 112. The light-blocking pattern 112 blocks light incident on the semiconductor layer 122 and prevents the semiconductor layer 122 from deteriorating due to the light.

The semiconductor layer 122 and the capacitor electrode 124 can be formed of polycrystalline silicon, and in this case, both ends of the semiconductor layer 122 and the capacitor electrode 124 can be doped with impurities. Alternatively, the semiconductor layer 122 and the capacitor electrode 124 can be formed of an oxide semiconductor material.

A gate insulation layer 130 of an insulating material and a gate electrode 132 of a second conductive material such as metal are sequentially formed on the semiconductor layer 122. The gate insulation layer 130 and the gate electrode 132 are disposed to correspond to a center of the semiconductor layer 122.

The gate insulation layer 130 can be formed of an inorganic insulating material such as silicon oxide ($SiO_2$) or silicon nitride (SiNx). When the semiconductor layer 122 is made of an oxide semiconductor material, it is preferable that the gate insulation layer 130 is formed of silicon oxide ($SiO_2$).

The gate electrode 132 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the gate electrode 132 can have a double-layered structure including a lower layer of a molybdenum-titanium alloy (MoTi) and an upper layer of copper (Cu), and the upper layer can have a thicker thickness than the lower layer.

As shown in the figure, the gate insulation layer 130 can be patterned to have substantially the same shape as the gate electrode 132. At this time, a width of the gate insulation layer 130 can be wider than a width of the gate electrode 132, and thus, edges of a top surface of the gate insulation layer 130 can be exposed. Alternatively, the width of the gate insulation layer 130 can be the same as the width of the gate electrode 132. Otherwise, the gate insulation layer 130 may not be patterned and can be formed substantially over the entire surface of the substrate 100.

Meanwhile, a gate line can be further formed of the same material and on the same layer as the gate electrode 132.

An interlayer insulation layer 140 made of an insulating material is formed on the gate electrode 132 substantially over the entire surface of the substrate 100. The interlayer insulation layer 140 can be formed of an inorganic insulating material such as silicon oxide ($SiO_2$) or silicon nitride (SiNx). Alternatively, the interlayer insulation layer 140 can be formed of an organic insulating material such as photo acryl or benzocyclobutene.

The interlayer insulation layer 140 has first, second, third, and fourth contact holes 140a, 140b, 140c, and 140d. The first and second contact holes 140a and 140b expose the both ends of the semiconductor layer 122, respectively. The third contact hole 140c partially exposes the top surface of the light-blocking pattern 112 and is located in the first hole 120a. Alternatively, the first hole 120a can be omitted, and the third contact hole 140c can be formed in the buffer layer 120 as well as in the interlayer insulation layer 140 to partially expose the top surface of the light-blocking pattern 112. The fourth contact hole 140d partially exposes the top surface of the first auxiliary electrode 114 and is located in the second hole 120b. Alternatively, the second hole 120b can be omitted, and the fourth contact hole 140d can be formed in the buffer layer 120 as well as in the interlayer insulation layer 140 to partially expose the top surface of the first auxiliary electrode 114.

Source and drain electrodes 142 and 144 and a second auxiliary electrode 146 made of a third conductive material such as metal are formed on the interlayer insulation layer 140. The source and drain electrodes 142 and 144 and the second auxiliary electrode 146 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the source and drain electrodes 142 and 144 and the second auxiliary electrode 146 can have a double-layered structure including a lower layer of a molybdenum-titanium alloy (MoTi) and an upper layer of copper (Cu), and the upper layer can have a thicker thickness than the lower layer. Alternatively, the source and drain electrodes 142 and 144 and the second auxiliary electrode 146 can have a triple-layered structure.

The source and drain electrodes 142 and 144 contact the both ends of the semiconductor layer 122 through the first and second contact holes 140a and 140b, respectively. Further, the drain electrode 144 contacts the light-blocking pattern 112 through the third contact hole 140c and overlaps the capacitor electrode 124. The capacitor electrode 124 overlaps the light-blocking pattern 112 and the drain electrode 144 to form a storage capacitor.

Meanwhile, the second auxiliary electrode 146 contacts the first auxiliary electrode 114 through the fourth contact hole 140d. The second auxiliary electrode 146 can be omitted.

In addition, a data line can be further formed on the interlayer insulation layer 140 and can be made of the third conductive material.

The semiconductor layer 122, the gate electrode 132, and the source and drain electrodes 142 and 144 form a thin film transistor Tr. The thin film transistor Tr has a coplanar structure in which the gate electrode 132 and the source and drain electrodes 142 and 144 are located at the same side with respect to the semiconductor layer 122.

Alternatively, the thin film transistor Tr can have an inverted staggered structure in which the gate electrode and the source and drain electrodes are located at different sides with respect to the semiconductor layer. For example, the gate electrode can be disposed under the semiconductor layer, and the source and drain electrodes can be disposed over the semiconductor layer. In this case, the semiconductor layer can be formed of oxide semiconductor or amorphous silicon.

The thin film transistor Tr corresponds to the driving thin film transistor T2 of FIG. 1, and a switching thin film transistor T1 of FIG. 1 having the same structure as the thin film transistor Tr can be further formed on the substrate 100.

A passivation layer 150 of an insulating material is formed on the source and drain electrodes 142 and 144 and the second auxiliary electrode 146 substantially over the entire surface of the substrate 100. The passivation layer 150 can be formed of an inorganic insulating material such as silicon oxide ($SiO_2$) or silicon nitride (SiNx).

Next, an overcoat layer 155 of an insulating material is formed on the passivation layer 150 substantially over the entire surface of the substrate 100. The overcoat layer 155 can be formed of an organic insulating material such as photo acryl or benzocyclobutene. The overcoat layer 155 can eliminate level differences due to under layers and have a substantially flat top surface.

Here, one of the passivation layer 150 and the overcoat layer 155 can be omitted. For example, the passivation layer 150 can be omitted, but is not limited thereto.

The passivation layer 150 and the overcoat layer 155 have a drain contact hole 155a exposing the drain electrode 144. Further, the passivation layer 150 and the overcoat layer 155 have a fifth contact hole 155b exposing the second auxiliary electrode 146.

A first electrode 160, which has relatively high work function, is formed on the overcoat layer 155 in each emission area EA1, EA2, and EA3. The first electrode 160 is in contact with the drain electrode 144 through the drain contact hole 155a.

For example, the first electrode 160 can be formed of a transparent conductive material such as indium tin oxide (ITO) or indium zinc oxide (IZO), but is not limited thereto.

Meanwhile, the electroluminescent display device according to the embodiment of the present disclosure can be a top emission type in which light of a light-emitting diode is output toward a direction opposite the substrate 100. Accordingly, the first electrode 160 can further include a reflective electrode or a reflective layer formed of a metal material having a relatively high reflectance below the layer of the transparent conductive material. For example, the reflective electrode or reflective layer can be formed of an aluminum-palladium-copper (APC) alloy, silver (Ag), aluminum (Al), or molybdenum (Mo). The first electrode 160 can have a triple-layer structure of ITO/APC/ITO, ITO/Ag/ITO, ITO/Al/ITO, or ITO/Mo/ITO, but is not limited thereto.

In addition, a connection pattern 162 is formed on the overcoat layer 155 between the first emission area EA1 and the second emission area EA2 adjacent to each other, more particularly, between the second transparent area TA2 and the second emission area EA2 and is formed of the same material as the first electrode 160. The connection pattern 162 is in contact with the second auxiliary electrode 146 through the fifth contact hole 155b.

A bank 170 of an insulating material is formed on the first electrode 160 and the connection pattern 162. The bank 170 overlaps and covers edges of each of the first electrode 160 and the connection pattern 162.

The bank 170 has a first opening 170a and a second opening 170b. The first opening 170a corresponds to the first emission area EA1 and the second transparent area TA2, and the second opening 170b corresponds to the first transparent area TA1. The first electrode 160 is exposed through first opening 170a in the first emission area EA1, and a top surface of the overcoat layer 155 is exposed through the second opening 170b in the first transparent area TA1.

Further, the bank 170 also has an auxiliary contact hole 170d between the first emission area EA1 and the second emission area EA2 adjacent to each other, more particularly, between the second transparent area TA2 and the second emission area EA2 adjacent to each other. A part of the connection pattern 162 is exposed through the auxiliary contact hole 170d.

The bank 170 further includes a third opening corresponding to each of the second and third emission areas EA2 and EA3, and this will be described in detail later.

The bank 170 includes a first bank 172 of a hydrophilic property and a second bank 174 of a hydrophobic property. The second bank 174 is disposed on the first bank 172. The second bank 174 has a narrower width than the first bank 172 and exposes edges of a top surface of the first bank 172. In addition, the second bank 174 can have a thicker thickness than the first bank 172.

Here, the second bank 174 substantially has the first and second openings 170a and 170b and the auxiliary contact hole 170d.

Accordingly, the first bank 172 overlaps and contacts edges of the first electrode 160 in the first emission area EA1, and the second bank 174 is spaced apart from the first electrode 160. At this time, an area between the second bank 174 and the first electrode 160 becomes the second transparent area TA2.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

In addition, at least a top surface of the second bank 174 is hydrophobic, and a side surface of the second bank 174 can be hydrophobic or hydrophilic. The second bank 174 can be formed of an organic insulating material having a hydrophobic property. Alternatively, the second bank 174 can be formed of an organic insulating material having a hydrophilic property and subjected to a hydrophobic treatment.

Meanwhile, the first bank 172 and the second bank 174 are formed of different materials and separated from each other. However, the hydrophilic first bank 172 and the hydrophobic second bank 174 can be formed of the same material and formed as one body. For example, an organic material layer having a top surface of a hydrophobic property can be formed substantially over the entire surface of the substrate 100, can be exposed to light through a halftone mask including a light-transmitting portion, a light-blocking portion and a half light-transmitting portion, and can be patterned, thereby forming the hydrophilic first bank 172 and the hydrophobic second bank 174 having different widths and thicknesses.

Alternatively, the first bank 172 can be omitted.

A light-emitting layer 180 is formed on the first electrode 160 exposed through the first opening 170a. Side surfaces of the light-emitting layer 180 facing each other are enclosed by the second bank 174. The light-emitting layer 180 on the first electrode 160 of the first emission area EA1 extends into the second transparent area TA2. For example, the light-emitting layer 180 is disposed in both the first emission area EA1 and the second transparent area TA2.

The light-emitting layer 180 is in contact with top and side surfaces of the first bank 172 and side surfaces of the second bank 174.

The light-emitting layer 180 includes a light-emitting material layer. The light-emitting material layer can be formed of any one of red, green, and blue luminescent materials, but is not limited thereto. The luminescent material can be an organic luminescent material such as a phosphorescent compound or a fluorescent compound or can be an inorganic luminescent material such as a quantum dot.

Further, the light-emitting layer 180 can further include a first charge auxiliary layer under the light-emitting material layer and a second charge auxiliary layer on the light-emitting material layer.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

The light-emitting layer 180 is formed through a solution process. Thus, the process can be simplified and a display device with a large size and high resolution can be provided. A spin coating method, an ink jet printing method, or a screen printing method can be used as the solution process, but the present disclosure is not limited thereto.

When the solution is dried, a drying speed of a solvent in a region adjacent to the second bank 174 is different from that in other regions. For example, the drying speed of the solvent in the region adjacent to the second bank 174 is faster than that in the other regions. Therefore, a height of the light-emitting layer 180 in the region adjacent to the second bank 174 can rise as it gets closer to the second bank 174. The height of the light-emitting layer 180 at an edge of the first emission area EA1 is higher than the height of the light-emitting layer 180 at a center of the first emission area EA1.

Meanwhile, the electron auxiliary layer of the light-emitting layer 180 can be formed through a thermal evaporation process. Accordingly, the electron auxiliary layer can be formed substantially over the entire surface of the substrate 100.

A second electrode 190 of a conductive material having a relatively low work function is formed on the light-emitting layer 180, the second bank 174, and the connection patterns 162 substantially over the entire surface of the substrate 100, and more particularly, substantially all over a display area including the plurality of pixels P. Accordingly, the second electrode 190 is formed in all the first, second, and third emission areas EA1, EA2, and EA3 and the first and second transparent areas TA1 and TA2.

The second electrode 190 can be formed of aluminum (Al), magnesium (Mg), silver (Ag), or an alloy thereof. The second electrode 190 has a relatively thin thickness such that light from the light-emitting layer 180 can be transmitted therethrough. For example, the second electrode 190 can have the thickness of 5 nm to 10 nm.

The second electrode 190 contacts top and side surfaces of the bank 170. More particularly, the second electrode 190 is in contact with the top and side surfaces of the second bank 174, and the second electrode 190 can be in contact with the top and side surfaces of the first bank 172.

Meanwhile, the second electrode 190 is electrically connected to the connection pattern 162 through the auxiliary contact hole 170d. Accordingly, the second electrode 190 is electrically connected to the first and second auxiliary electrodes 114 and 146 through the connection pattern 162. At this time, the second electrode 190 can be in direct contact with the connection pattern 162. Alternatively, when the electron auxiliary layer of the light-emitting layer 180 is formed substantially over the entire surface of the substrate 100, the second electrode 190 can be in indirect contact with the connection pattern 162.

In addition, the second electrode 190 contacts the top surface of the overcoat layer 155 in the first transparent area TA1. The second electrode 190 can be in direct contact with the top surface of the overcoat layer 155 in the first transparent area TA1.

In the transparent display device 1000 according to the first embodiment of the present disclosure, the first bank 172 and the light-emitting layer 180 are further formed in the second transparent area TA2 compared to the first transparent area TA1. Accordingly, the transmittance of the first transparent area TA1 is higher than the transmittance of the second transparent area TA2.

The first electrode 160, the light-emitting layer 180, and the second electrode 190 constitute a light-emitting diode De. The first electrode 160 can serve as an anode, and the second electrode 190 can serve as a cathode, but is not limited thereto.

As described above, the transparent display device 1000 according to the first embodiment of the present disclosure can be a top emission type in which light from the light-emitting layer 180 of the light-emitting diode De is output toward a direction opposite the substrate 100, for example, output to the outside through the second electrode 190. The top emission type display device can have a wider emission area than a bottom emission type display device of the same size, to thereby improve luminance and reduce power consumption.

At this time, the light-emitting diode De of each sub-pixel can have an element thickness for a micro-cavity effect corresponding to a wavelength of the emitted light, thereby increasing the light efficiency. Here, the element thickness can be defined as a thickness of the light-emitting layer 180, for example, a distance between the first electrode 160 and the second electrode 190, but is not limited thereto. For example, the element thickness of the second emission area EA2 can be smaller than the element thickness of the first emission area EA1 and greater than the element thickness of the third emission area EA3.

In the meantime, a protective layer and/or an encapsulating layer can be formed on the second electrode 190 substantially over the entire surface of the substrate 100 to block moisture or oxygen introduced from the outside, thereby protecting the light-emitting diode De.

In addition, a capping layer can be formed on the second electrode 190 substantially over the entire surface of the substrate 100. The capping layer can be formed of an insulating material having a relatively high refractive index. The wavelength of light traveling along the capping layer can be amplified by surface plasma resonance, and thus the intensity of the peak can be increased, thereby improving the light efficiency in the top emission type electroluminescent display device. For example, the capping layer can be formed as a single layer of an organic layer or an inorganic layer or formed as organic/inorganic stacked layers.

In the transparent display device 1000 according to the first embodiment of the present disclosure, the light-emitting layers 180 of adjacent sub-pixels are connected to each other and formed as one body, thereby reducing or minimizing the deviation in the dropping amounts between nozzles. The configuration of these emission areas and transparent areas can be implemented by a bank structure, and this will be described in detail with reference to FIGS. 4 to 6.

Figure 4:
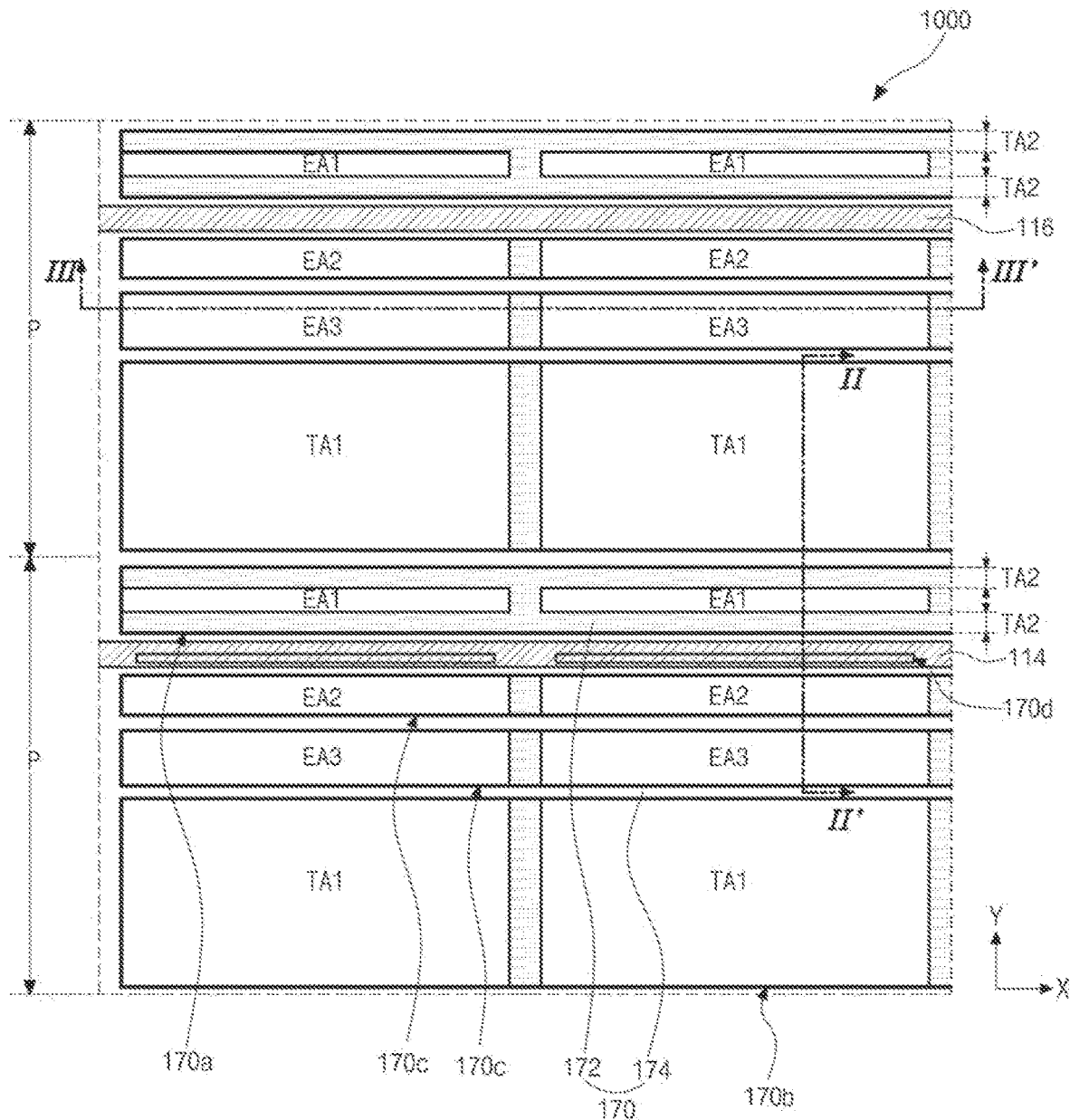
FIG. 4 is a schematic plan view of a bank structure of the transparent display device according to the first embodiment of the present disclosure.

FIG. 4 is a schematic plan view of a bank structure of the transparent display device according to the first embodiment of the present disclosure.

In FIG. 4, one or each pixel P of the transparent display device 1000 according to the first embodiment of the present disclosure includes the emission area and the transparent area. The emission area includes the first, second, and third emission areas EA1, EA2, and EA3, and the transparent area includes the first and second transparent areas TA1 and TA2.

The first, second, and third emission areas EA1, EA2, and EA3 and the first transparent area TA1 are sequentially arranged along the Y direction, and the second transparent area TA2 is disposed between the first emission area EA1 and the second emission area EA2 adjacent to each other and between the first emission area EA1 and the first transparent area TA1 adjacent to each other.

In addition, the first auxiliary electrode 114 of the low potential voltage line or the high potential voltage line 116, which extends along the X direction, is disposed between the second transparent area TA2 and the second emission area EA2 adjacent to each other. The first auxiliary electrode 114 and the high potential voltage line 116 are alternately arranged along the Y direction.

The first, second, and third emission areas EA1, EA2, and EA3 and the first and second transparent areas TA1 and TA2 are defined by the bank 170.

The bank 170 has the first, second, and third openings 170a, 170b, and 170c. The first opening 170a corresponds to the first emission area EA1 and the second transparent area TA2, the second opening 170b corresponds to the first transparent area TA1, and the third opening 170c corresponds to each of the second and third emission areas EA2 and EA3.

Here, each of the first and third openings 170a and 170c can be provided to correspond to the emission areas EA1, EA2, and EA3 of one sub-pixel row including the same color sub-pixels adjacent to each other along the X direction. Specifically, the first opening 170a can correspond to the first emission areas EA1 of the sub-pixel row arranged along the X direction, and the third opening 170c can correspond to the second emission areas EA2 of the sub-pixel row arranged along the X direction or correspond to the third emission areas EA3 of the sub-pixel row arranged along the X direction. The second opening 170b can correspond to the first transparent areas TA1 arranged along the X direction.

In addition, the bank 170 further has the auxiliary contact hole 170d. The auxiliary contact hole 170d is disposed between the second transparent area TA2 and the second emission area EA2 adjacent to each other and overlaps the first auxiliary electrode 114. Meanwhile, the auxiliary contact hole 170d is not formed over the high potential voltage line 116.

The auxiliary contact hole 170d can be formed for every pixel P along the X direction. In this case, the electrical contact area between the second electrode of the light-emitting diode and the first auxiliary electrode 114 can increase, thereby improving the contact property. Alternatively, the auxiliary contact hole 170d can be formed for two pixels P along the X direction. In this case, it is possible to reduce the problem that can occur in the patterning process of the auxiliary contact hole 170d.

The bank 170 includes the first bank 172 of a hydrophilic property and the second bank 174 of a hydrophobic property. The second bank 174 substantially has the first, second, and third openings 170a, 170b, and 170c and the auxiliary contact hole 170d.

Here, the first bank 172 is disposed between adjacent same color sub-pixels along the X direction, and the second bank 174 is disposed between adjacent different color sub-pixels. For example, the first bank 172 is disposed between adjacent ones of the first, second, and third emission areas EA1, EA2, and EA3 along the X direction, and the second bank 174 is disposed between adjacent ones of the first, second, and third emission areas EA1, EA2, and EA3 along the Y direction. In addition, the second bank 174 is also disposed between the emission area and the transparent area, more particularly, between the third emission area EA3 and the first transparent area TA1 and between the second emission area EA2 and the second transparent area TA2. Moreover, the second bank 174 is further disposed between the first transparent area TA1 and the second transparent area TA2.

Meanwhile, the first bank 172 is also disposed in the second transparent area TA2. Accordingly, the light-emitting layer of the first emission area EA1 extends into the second transparent area TA2.

In the transparent display device 1000 according to the first embodiment of the present disclosure, the light-emitting layers of the same color sub-pixels are connected to each other and formed as one body due to the first and third openings 170a and 170c, thereby reducing or minimizing the deviation in the dropping amounts between nozzles and uniformly forming the thicknesses of the light-emitting layers of the sub-pixels. Therefore, the mura is prevented, thereby effectively preventing the image quality of the display device from being lowered.

Figure 5:
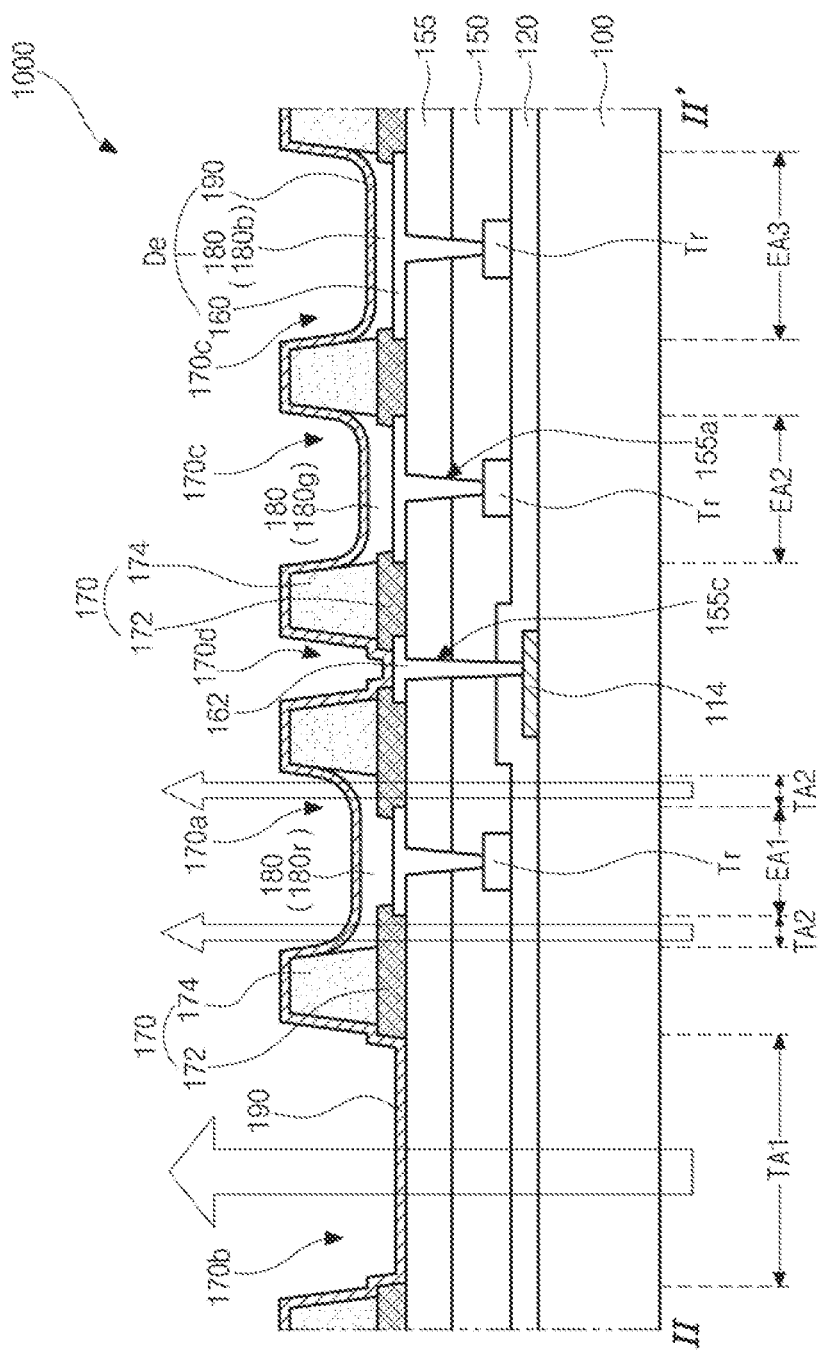
FIG. 5 is a cross-sectional view corresponding to the line II-IF of FIG. 4.
Figure 6:
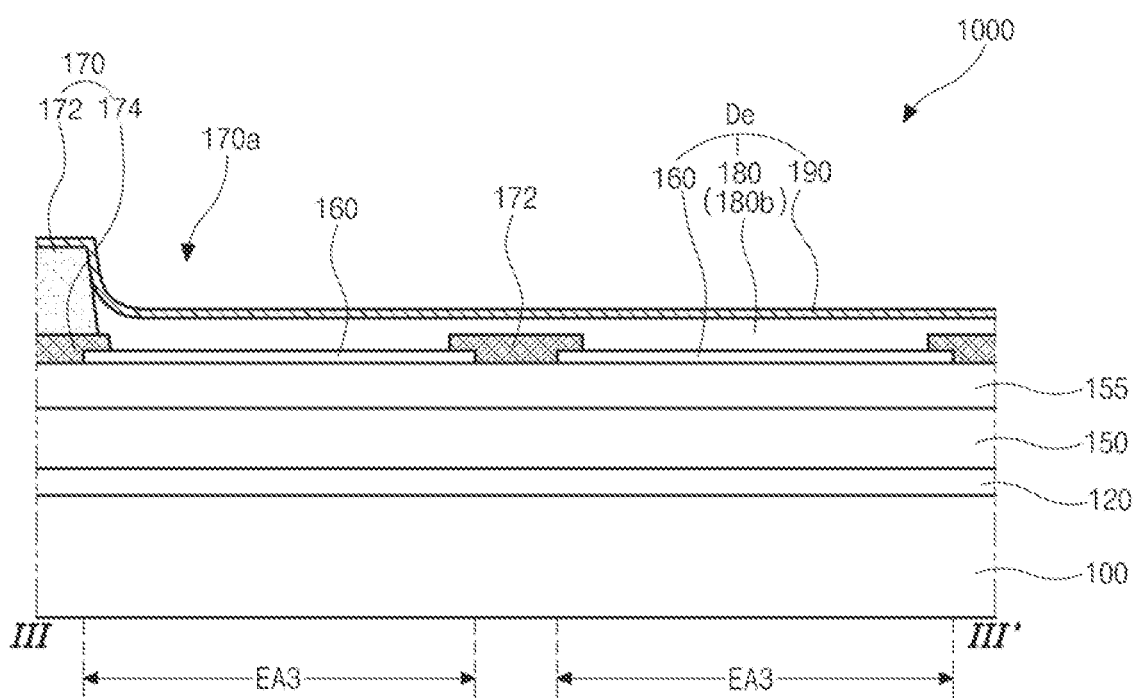
FIG. 6 is a cross-sectional view corresponding to the line of FIG. 4.

A cross-sectional structure of the transparent display device 1000 according to the first embodiment of the present disclosure is shown in FIG. 5 and FIG. 6.

Particularly, FIG. 5 is a cross-sectional view corresponding to the line II-II' of FIG. 4, and FIG. 6 is a cross-sectional view corresponding to the line of FIG. 4. These figures will be described with referent to FIG. 3 and FIG. 4 together.

As shown in FIG. 5 and FIG. 6, in the transparent display device 1000 according to the first embodiment of the present disclosure, the pixel P including the first, second, and third emission areas EA1, EA2, and EA3 and the first and second transparent areas TA1 and TA2 is defined on the substrate 100. Here, the first, second, and third emission areas EA1, EA2, and EA3 have different widths. For example, the width of the second emission area EA2 is greater than the width of the first emission area EA1 and smaller than the width of the third emission area EA3.

The first emission area EA1 and the second transparent area TA2 are disposed between the first transparent area TA1 and the second emission area EA2, and the second transparent area TA2 is disposed at both sides of the first emission area EA1.

The first auxiliary electrode 114 is formed between the second emission area EA2 and the second transparent area TA2 on the substrate 100. The buffer layer 120 is formed substantially on an entire surface of the substrate 100, and the thin film transistor Tr is formed to correspond to each of the first, second, and third emission areas EA1, EA2, and EA3 of the respective sub-pixels on the buffer layer 120.

Here, the thin film transistor Tr can have the same configuration as that of FIG. 3.

Then, the passivation layer 150 and the overcoat layer 155 are sequentially formed on the thin film transistor Tr substantially over the entire surface of the substrate 100, and the first electrode 160 is formed on the overcoat layer 155 in each of the first, second, and third emission areas EA1, EA2, and EA3 of the respective sub-pixels.

At least one insulation layer can be further formed between the buffer layer 120 and the passivation layer 150.

The passivation layer 150 and the overcoat layer 155 have the drain contact hole 155a exposing a part of the thin film transistor Tr, for example, the drain electrode, and the first electrode 160 is in contact with the drain electrode of the thin film transistor Tr through the drain contact hole 155a.

Meanwhile, the connection pattern 162 is formed on the overcoat layer 155 between the second emission area EA2 and the second transparent area TA2 and formed of the same material as the first electrode 160. At this time, the overcoat layer 155 has a contact hole 155c corresponding to the first auxiliary electrode 114, and the connection pattern 162 is electrically connected to the first auxiliary electrode 114 through the contact hole 155c. Here, it is illustrated that the contact hole 155c is also formed in the passivation layer 150 and the buffer layer 120, but is not limited thereto. Alternatively, a second auxiliary electrode can be further formed between the connection pattern 162 and the first auxiliary electrode 114. In this case, the contact hole 155c can be formed only in the overcoat layer 155 and the passivation layer 150, and the buffer layer 120 can have another contact hole exposing the second auxiliary electrode.

Next, the bank 170 is formed on the first electrode 160 and the connection pattern 162. The bank 170 has a first opening 170a, a second opening 170b, and a third opening 170c. The first opening 170a corresponds to the first emission area EA1 and the second transparent area TA2, the second opening 170b corresponds to the first transparent area TA1, and the third opening 170c corresponds to each of the second and third emission areas EA2 and EA3. In addition, the bank 170 also has an auxiliary contact hole 170d between the second emission area EA2 and the second transparent area TA2. The auxiliary contact hole 170d corresponds to the first auxiliary electrode 114.

The bank 170 includes the first bank 172 of a hydrophilic property and the second bank 174 of a hydrophobic property.

The first bank 172 is formed between adjacent same color sub-pixels. On the other hand, the second bank 174 is formed between the adjacent different color sub-pixels and exposes the first bank 172 disposed between the adjacent same color sub-pixels. Accordingly, in FIG. 5 and FIG. 6, the second bank 174 is formed between adjacent ones of the first, second, and third emission areas EA1, EA2, and EA3, and the first bank 172 is formed between adjacent third emission areas EA3. The first bank 172 is also formed between adjacent first emission areas EA1 and between adjacent second emission areas EA2.

In addition, the second bank 174 is formed between adjacent first and second transparent areas TA1 and TA2 and between the second transparent area TA2 and the second emission area EA2 adjacent to each other.

Meanwhile, the first bank 172 is also formed in the second transparent area TA2. Moreover, the first bank 172 can be further formed under the second bank 174. Accordingly, the first bank 172 is formed between the adjacent ones of the first, second, and third emission areas EA1, EA2, and EA3 and also formed between the adjacent first and second transparent areas TA1 and TA2 and between the second transparent area TA2 and the second emission area EA2 adjacent to each other.

The light-emitting layer 180 is formed on the first electrode 160 exposed through each of the first and third openings 170a and 170c. The light-emitting layer 180 includes red, green, and blue light-emitting layers 180r, 180g, and 180b corresponding to the first, second, and third emission areas EA1, EA2, and EA3, respectively. The red light-emitting layer 180r is formed in the second transparent area TA2 as well as in the first emission area EA1.

The red, green, and blue light-emitting layers 180r, 180g, and 180b have different thicknesses. For example, the thickness of the green light-emitting layer 180g is smaller than the thickness of the red light-emitting layer 180r and greater than the thickness of the blue light-emitting layer 180b.

Here, the light-emitting layer 180 is also formed on the first bank 172 exposed between the adjacent same color sub-pixels. The light-emitting layer 180 on the first bank 172 is connected to the light-emitting layer 180 on the first electrode 160 adjacent thereto to thereby form one body. For example, as shown in FIG. 6, the blue light-emitting layer 180b is formed on the first bank 172 between the adjacent third emission areas EA3, and the blue light-emitting layer 180b on the first bank 172 is connected to the blue light-emitting layer 180b of the third emission area EA3 adjacent thereto, thereby forming one body.

The light-emitting layer 180 is formed through a solution process. Here, solutions dropped through different nozzles corresponding to the same color sub-pixel row are connected to each other, and the solutions are dried, thereby forming the light-emitting layer 180. Accordingly, the deviation in the dropping amounts between the nozzles is reduced or minimized, so that the thicknesses of thin films formed in respective sub-pixels can be uniformly formed.

At this time, the red light-emitting layer 180r, which is formed in the first emission area EA1 having the narrowest width and has the thickest thickness, is formed in the second transparent area TA2 as well as in the first emission area EA1, so that an area where the solution is dropped can be sufficiently secured. In addition, a distance between the red light-emitting layer 180r and the green light-emitting layer 180g can be increased due to the first auxiliary electrode 114 and the auxiliary contact hole 170d between the second transparent area TA2 and the second emission area EA2. Accordingly, it is possible to prevent the color mixing between the red light-emitting layer 180r and the green light-emitting layer 180g.

Next, the second electrode 190 is formed on the light-emitting layer 180. The first electrode 160, the light-emitting layer 180, and the second electrode 190 constitute a light-emitting diode De.

Here, the second electrode 190 is formed substantially over the entire surface of the substrate 100, more particularly, substantially all over a display area where the plurality of pixels P is provided. Namely, the second electrode 190 is formed in all the first, second, and third emission areas EA1, EA2, and EA3 and the first and second transparent areas TA1 and TA2 and also formed on the bank 170.

The second electrode 190 is electrically connected to the first auxiliary electrode 114 through the auxiliary contact hole 170d. Specifically, the second electrode 190 is electrically connected to the connection pattern 162 through the auxiliary contact hole 170d, and the connection pattern 162 is electrically connected to the first auxiliary electrode 114 through the contact hole 155c. Therefore, the second electrode 190 is electrically connected to the first auxiliary electrode 114 through the connection pattern 162. Here, the second electrode 190 can be in direct contact with the connection pattern 162.

In addition, the second electrode 190 also contacts the overcoat layer 155 exposed through the second opening 170b in the first transparent area TA1.

In the transparent display device 1000 according to the first embodiment of the present disclosure, the first bank 172 and the light-emitting layer 180 are further formed in the second transparent area TA2 compared to the first transparent area TA1. Accordingly, the transmittance of the first transparent area TA1 is higher than the transmittance of the second transparent area TA2.

As described above, in the transparent display device 1000 according to the first embodiment of the present disclosure, one pixel P includes the emission area EA and the transparent area TA, so that the surrounding environment information such as backgrounds can be shown through the transparent areas TA while displaying the image information through the emission areas EA.

In addition, in the transparent display device 1000 according to the first embodiment of the present disclosure, by forming at least some of the light-emitting layer 180 through the solution process, a fine metal mask can be omitted to thereby reduce the manufacturing costs, and a display device with a large size and high definition can be implemented.

Further, the transparent display device 1000 according to the first embodiment of the present disclosure is implemented as the top emission type, thereby improving the luminance and reducing the power consumption. Here, since the second electrode 190 is formed to have the relatively thin thickness in order to transmit light, the resistance of the second electrode 190 can be increased, but the resistance of the second electrode 190 can be lowered by electrically connecting the second electrode 190 to the first auxiliary electrode 114 through the connection pattern 162.

Moreover, in the transparent display device 1000 according to the first embodiment of the present disclosure, the light-emitting layers 180 of the same color sub-pixels are connected to each other and formed as one body, thereby reducing or minimizing the deviation in the dropping amounts between the nozzles and uniformly forming the thicknesses of the light-emitting layers 180 of respective sub-pixels.

Additionally, the second transparent area TA2 is provided at both sides of the first emission area EA1 having the smallest size such that the light-emitting layer 180 of the first emission area EA1 having the thickest thickness extends into the second transparent area TA2, thereby preventing the color mixing between the first emission area EA1 and the second emission area EA2.

Further, the first auxiliary electrode 114 is disposed between the first emission area EA1 and the second emission area EA2, more particularly, between the second transparent area TA2 and the second emission area EA2, so that the color mixing between the first emission area EA1 and the second emission area EA2 can be further prevented. The size of the auxiliary contact hole 170d can also be increased, and the contact area between the second electrode 190 and the connection pattern 162 can be increased, thereby improving the contact property between the second electrode 190 and the connection pattern 162.

In the present disclosure, the first auxiliary electrode can be provided to overlap the first emission area EA1. Such a transparent display device according to a second embodiment of the present disclosure will be described in detail with reference to FIG. 7.

Figure 7:
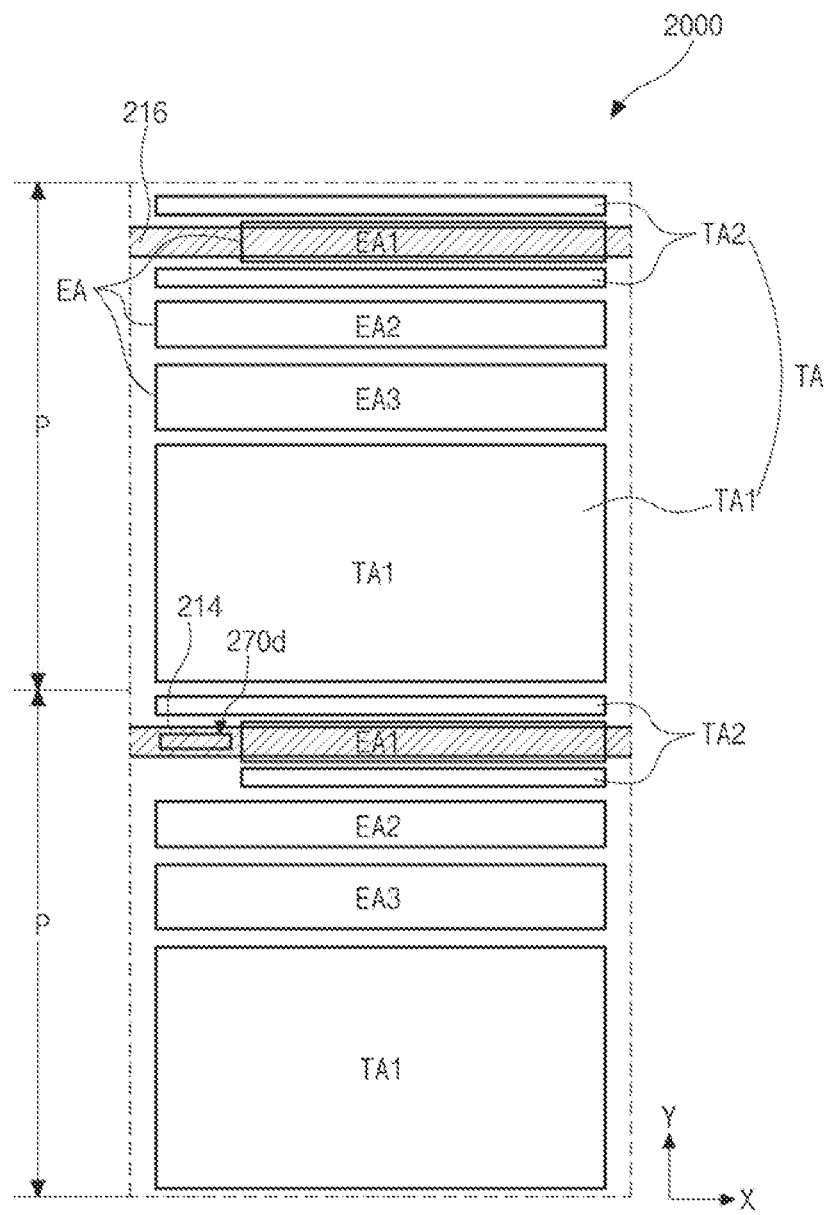
FIG. 7 is a schematic plan view of a transparent display device according to a second embodiment of the present disclosure.

FIG. 7 is a schematic plan view of a transparent display device according to a second embodiment of the present disclosure.

As shown in FIG. 7, in a transparent display device 2000 according to the second embodiment of the present disclosure, one or each pixel P includes an emission area EA and a transparent area TA. At this time, each pixel P can include first, second, and third emission areas EA1, EA2, and EA3 corresponding to first, second, and third sub-pixels, for example, red, green, and blue sub-pixels, respectively and first and second transparent areas TA1 and TA2.

The first and second transparent areas TA1 and TA2 have different transmittances. Here, the transmittance of the first transparent area TA1 is higher than the transmittance of the second transparent area TA2 based on the same area.

The first, second, and third emission areas EA1, EA2, and EA3 and the first transparent area TA1 can be sequentially arranged along a first direction, for example, Y direction, and the second transparent area TA2 can be disposed at both sides of the first emission area EA1. For example, the second transparent area TA2 can include a first portion disposed between the first emission area EA1 and the second emission area EA2 adjacent to each other and a second portion disposed between the first emission area EA1 and the first transparent area TA1 adjacent to each other. Here, the second portion of the second transparent area TA2 disposed between the first emission area EA1 and the first transparent area TA1 can be omitted.

The first, second, and third emission areas EA1, EA2, and EA3 can have different sizes. For example, the size of the second emission area EA2 of the green sub-pixel can be larger than the size of the first emission area EA1 of the red sub-pixel and smaller than the size of the third emission area EA3 of the blue sub-pixel, but is not limited thereto.

At this time, the second and third emission areas EA2 and EA3 can have the same length along a second direction, for example, X direction, and the first emission area EA1 can have a smaller length than the second and third emission areas EA2 and EA3. In addition, the first and second emission areas EA1 and EA2 can have smaller widths than the third emission area EA3, and the widths of the first and second emission areas EA1 and EA2 can be the same or different.

Meanwhile, a signal line 214 and 216 is disposed to overlap the first emission area EA1. The signal line 214 and 216 includes a first auxiliary electrode 214 of a low potential voltage line for supplying a low potential voltage VSS and a high potential voltage line 216 for supplying a high potential voltage VDD.

The width of the first emission area EA1 can be wider than a width of the first auxiliary electrode 214 or the high potential voltage line 216.

The first auxiliary electrode 214 and the high potential voltage line 216 extend along the X direction and alternate each other along the Y direction. Namely, the first auxiliary electrode 214 is disposed in one of adjacent two pixels P along the Y direction, and the high potential voltage line 216 is disposed in the other of the adjacent two pixels P. The first auxiliary electrode 214 and the high potential voltage line 216 can be formed of the same material and on the same layer. However, the present disclosure is not limited thereto.

A contact hole 270d is formed to correspond to the first auxiliary electrode 214, and the first auxiliary electrode 214 is electrically connected to a cathode of a light-emitting diode through the contact hole 270d. Here, the contact hole 270d is disposed substantially between the second portions of the second transparent area TA2.

Meanwhile, the first and second portions of the second transparent area TA2 can have different lengths for each pixel P. For example, in the pixel P where the first auxiliary electrode 214 is disposed, the second portion of the second transparent area TA2 can have a longer length than the first portion of the second transparent area TA2. Alternatively, in the pixel P where the high potential voltage line 216 is disposed, the first and second portions of the second transparent area TA2 can have the same length. However, the present disclosure is not limited thereto. In the pixel P where the high potential voltage line 216 is disposed, the length of the second portion of the second transparent area TA2 can be longer than the length of the first portion of the second transparent area TA2.

A cross-sectional structure of the transparent display device 2000 according to the second embodiment of the present disclosure will be described in detail with reference to FIGS. 8 to 10.

Figure 8:
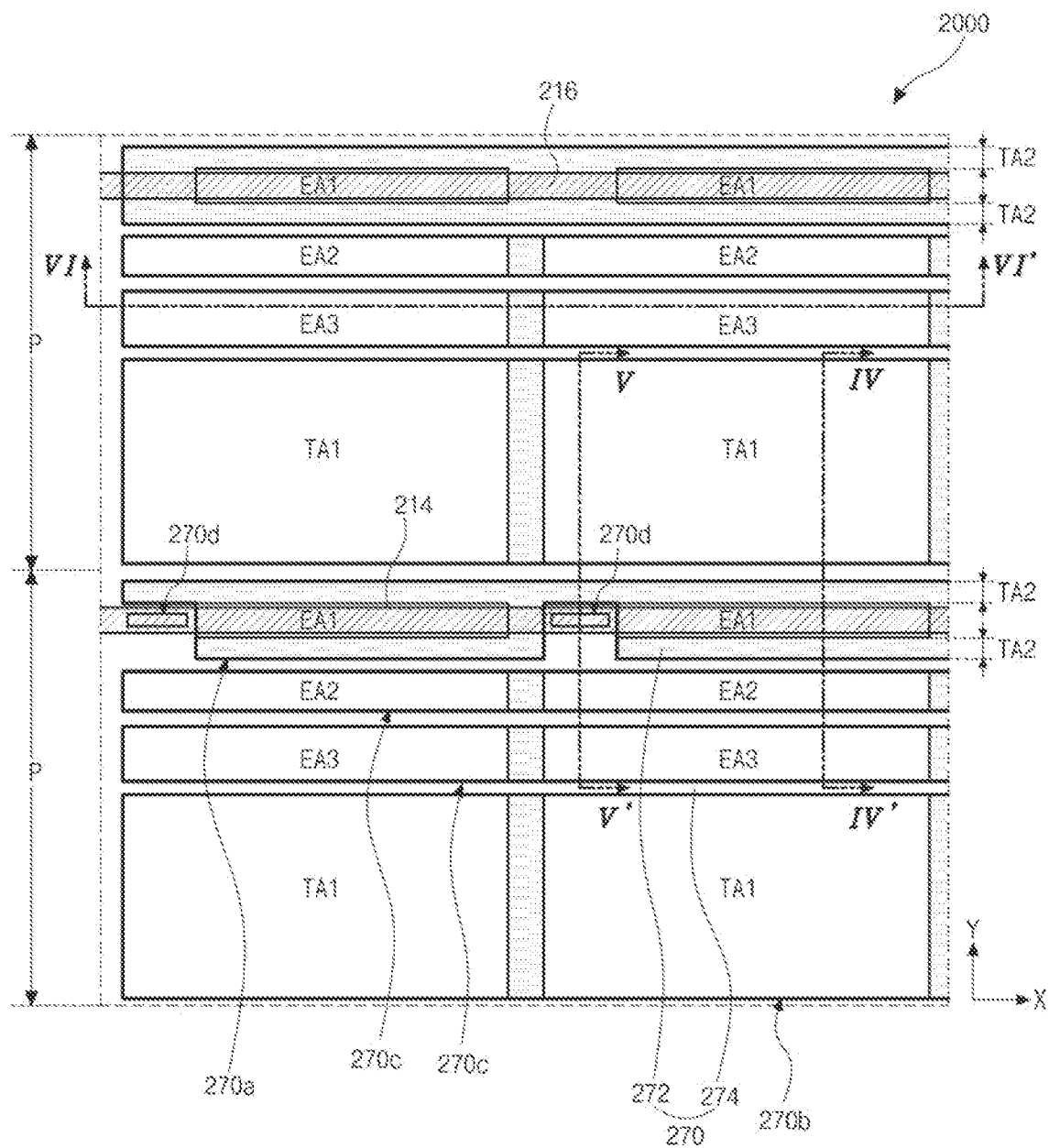
FIG. 8 is a schematic plan view of a bank structure of the transparent display device according to the second embodiment of the present disclosure.

FIG. 8 is a schematic plan view of a bank structure of the transparent display device according to the second embodiment of the present disclosure.

In FIG. 8, the first, second, and third emission areas EA1, EA2, and EA3 and the first and second transparent areas TA1 and TA2 of the transparent display device 2000 according to the second embodiment of the present disclosure are defined by the bank 270.

The bank 270 has the first, second, and third openings 270a, 270b, and 270c. The first opening 270a corresponds to the first emission area EA1 and the second transparent area TA2, the second opening 270b corresponds to the first transparent area TA1, and the third opening 270c corresponds to each of the second and third emission areas EA2 and EA3.

Here, each of the first and third openings 270a and 270c can be provided to correspond to the emission areas EA1, EA2, and EA3 of one sub-pixel row including the same color sub-pixels adjacent to each other along the X direction.

In addition, the bank 270 further has the auxiliary contact hole 270d. The auxiliary contact hole 270d is disposed between the first and second portions of the second transparent area TA2 and overlaps the first auxiliary electrode 214. Meanwhile, the auxiliary contact hole 270d is not formed over the high potential voltage line 216.

The auxiliary contact hole 270d can be formed for every pixel P along the X direction. In this case, the electrical contact area between the second electrode of the light-emitting diode and the first auxiliary electrode 214 can increase, thereby improving the contact property. Alternatively, the auxiliary contact hole 270d can be formed for two pixels P along the X direction. In this case, it is possible to reduce the problem that can occur in the patterning process of the auxiliary contact hole 270d.

The bank 270 includes the first bank 272 of a hydrophilic property and the second bank 274 of a hydrophobic property. The second bank 274 substantially has the first, second, and third openings 270a, 270b, and 270c and the auxiliary contact hole 270d.

The first bank 272 is disposed between adjacent same color sub-pixels along the X direction, and the second bank 274 is disposed between adjacent different color sub-pixels. For example, the first bank 272 is disposed between adjacent ones of the first, second, and third emission areas EA1, EA2, and EA3 along the X direction, and the second bank 274 is disposed between adjacent ones of the first, second, and third emission areas EA1, EA2, and EA3 along the Y direction. In addition, the second bank 274 is also disposed between the emission area and the transparent area, more particularly, between the third emission area EA3 and the first transparent area TA1 and between the second emission area EA2 and the second transparent area TA2. Moreover, the second bank 274 is further disposed between the first transparent area TA1 and the second transparent area TA2.

The second bank 274 has a protrusion corresponding to the auxiliary contact hole 270d. Accordingly, the width of the first opening 270a corresponding to the auxiliary contact hole 270d is smaller than the width of the first opening 270a corresponding to the first emission area EA1.

Meanwhile, the first bank 272 is also disposed in the second transparent area TA2. Accordingly, the light-emitting layer of the first emission area EA1 extends into the second transparent area TA2.

In the transparent display device 2000 according to the second embodiment of the present disclosure, the light-emitting layers of the same color sub-pixels are connected to each other and formed as one body due to the first and third openings 270a and 270c, thereby reducing or minimizing the deviation in the dropping amounts between nozzles and uniformly forming the thicknesses of the light-emitting layers of the sub-pixels. Therefore, the mura is prevented, thereby effectively preventing the image quality of the display device from being lowered.

Figure 9:
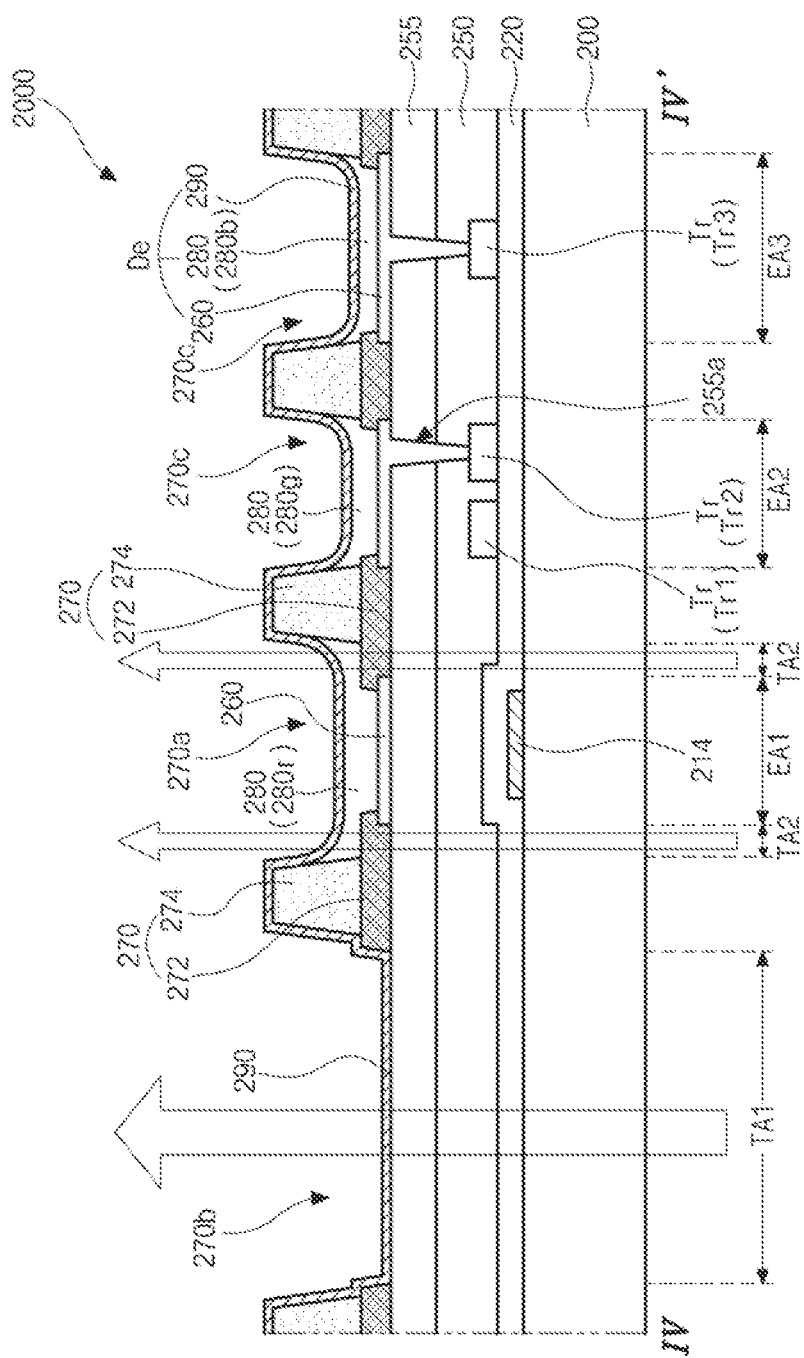
FIG. 9 is a cross-sectional view corresponding to the line IV-IV' of FIG. 8.
Figure 10:
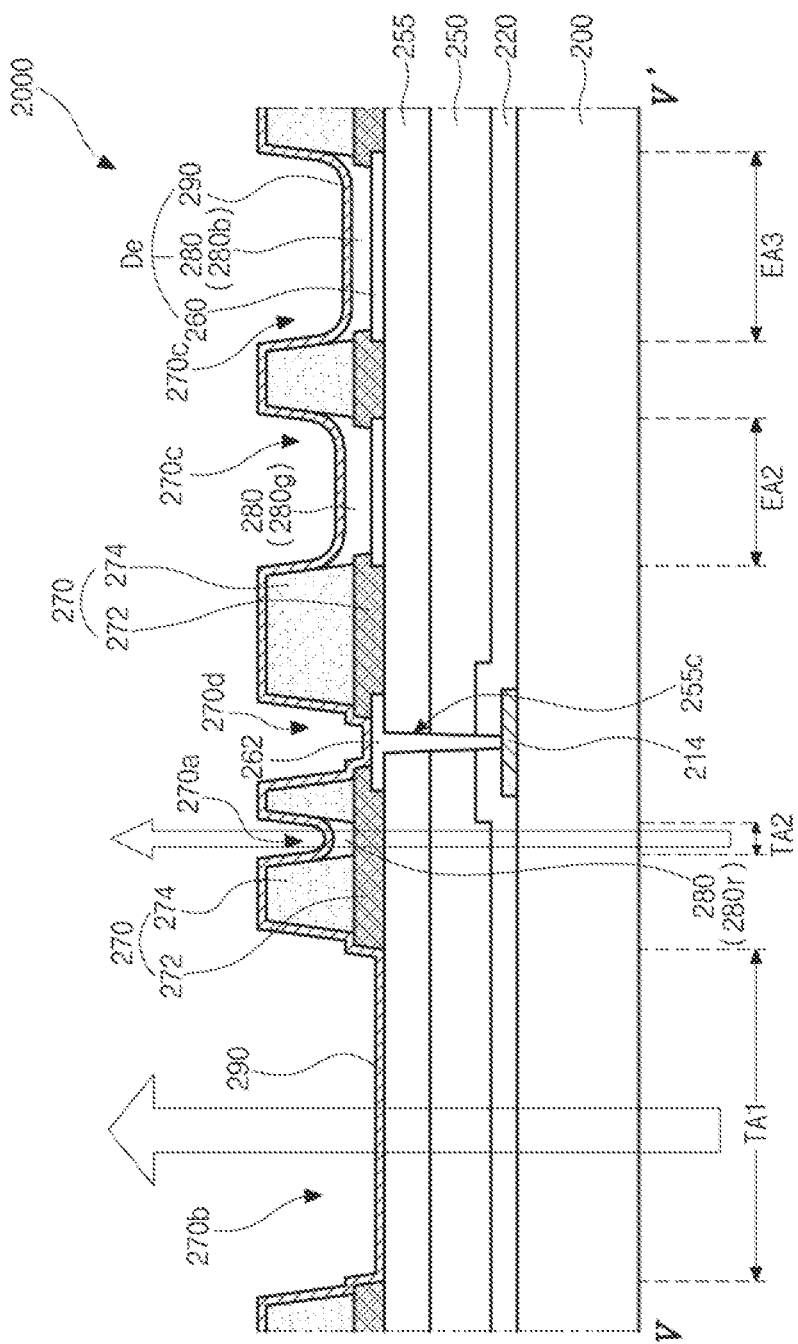
FIG. 10 is a cross-sectional view corresponding to the line V-V' of FIG. 8.

A cross-sectional structure of the transparent display device 2000 according to the second embodiment of the present disclosure is shown in FIG. 9 and FIG. 10.

Figure 11:
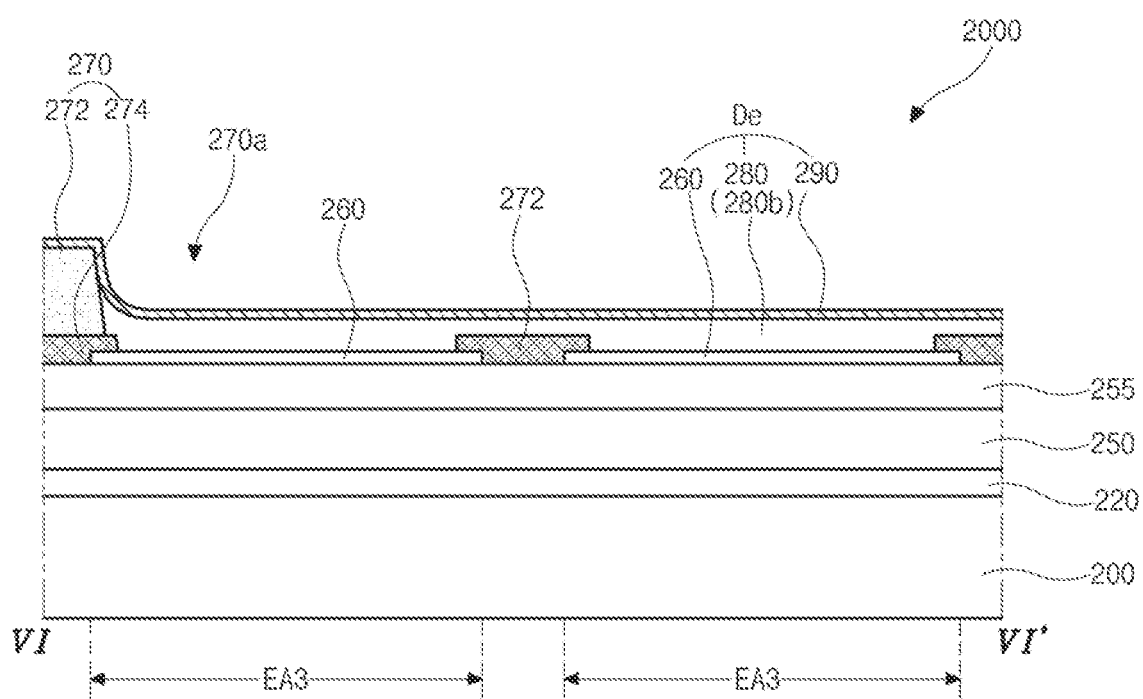
FIG. 11 is a cross-sectional view corresponding to the line VI-VI' of FIG. 8.

Particularly, FIG. 9 is a cross-sectional view corresponding to the line IV-IV' of FIG. 8, FIG. 10 is a cross-sectional view corresponding to the line V-V' of FIG. 8, and FIG. 11 is a cross-sectional view corresponding to the line VI-VI' of FIG. 8. These figures will be described with referent to FIGS. 7 and 8 together.

As shown in FIG. 9, FIG. 10, and FIG. 11, in the transparent display device 2000 according to the second embodiment of the present disclosure, the pixel P including the first, second, and third emission areas EA1, EA2, and EA3 and the first and second transparent areas TA1 and TA2 is defined on a substrate 200. Here, the first and second emission areas EA1 and EA2 have smaller widths than the third emission area EA3, and the first and second emission areas EA1 and EA2 have the same width or different widths.

The first emission area EA1 and the second transparent area TA2 are disposed between the first transparent area TA1 and the second emission area EA2, and the second transparent area TA2 is disposed at both sides of the first emission area EA1.

The first auxiliary electrode 214 is formed in the first emission area EA1 on the substrate 200. A buffer layer 220 is formed substantially on an entire surface of the substrate 200, and thin film transistors Tr are formed to correspond to the second and third emission areas EA2 and EA3 on the buffer layer 220. Specifically, first and second thin film transistors Tr1 and Tr2 are disposed in the second emission area EA2, and a third thin film transistor Tr3 is disposed in the third emission area EA3. Alternatively, the first thin film transistor Tr1 can be disposed in the third emission area EA3.

Here, each of the first, second, and third thin film transistors Tr1, Tr2, and Tr3 can have the same configuration as the thin film transistor Tr of FIG. 3.

Then, a passivation layer 250 and an overcoat layer 255 are sequentially formed on the thin film transistors Tr substantially over the entire surface of the substrate 200, and a first electrode 260 is formed on the overcoat layer 255 in each of the first, second, and third emission areas EA1, EA2, and EA3 of the respective sub-pixels.

At least one insulation layer can be further formed between the buffer layer 220 and the passivation layer 250.

The passivation layer 250 and the overcoat layer 255 have a drain contact hole 255a exposing a part of the thin film transistor Tr, for example, a drain electrode, and the first electrode 260 is in contact with the drain electrode of the thin film transistor Tr through the drain contact hole 255a.

Here, the first electrode 260 in the first emission area EA1 is electrically connected to the first thin film transistor Tr1 in the second emission area EA2. For example, a thin film transistor is not formed in the first emission area EA1 where the first auxiliary electrode 214 is in order to prevent the coupling, and the first thin film transistor Tr1 is formed in the second or third emission area EA2 or EA3. The first electrode 260 in the first emission area EA1 can be connected to the first thin film transistor Tr1 through an additional contact hole and/or pattern between the second transparent area TA2 and the second or third emission area EA2 or EA3. Alternatively, the first electrode 260 in the first emission area EA1 can be connected to the first thin film transistor Tr1 in the second or third emission area EA2 or EA3.

Meanwhile, a connection pattern 262 is formed on the overcoat layer 255 between the second emission area EA2 and the second transparent area TA2 and formed of the same material as the first electrode 260. Specifically, the connection pattern 262 is disposed between the second portion of the second transparent area TA2 and the second emission area EA2. The connection pattern 262 overlaps the first auxiliary electrode 214.

The overcoat layer 255 has a contact hole 255c corresponding to the first auxiliary electrode 214, and the connection pattern 262 is electrically connected to the first auxiliary electrode 214 through the contact hole 255c. Here, it is illustrated that the contact hole 255c is also formed in the passivation layer 250 and the buffer layer 220, but is not limited thereto. Alternatively, a second auxiliary electrode can be further formed between the connection pattern 262 and the first auxiliary electrode 214. In this case, the contact hole 255c can be formed only in the overcoat layer 255 and the passivation layer 250, and the buffer layer 220 can have another contact hole exposing the second auxiliary electrode.

Next, a bank 270 is formed on the first electrode 260 and the connection pattern 262. The bank 270 has a first opening 270a, a second opening 270b, and a third opening 270c. The first opening 270a corresponds to the first emission area EA1 and the second transparent area TA2, the second opening 270b corresponds to the first transparent area TA1, and the third opening 270c corresponds to each of the second and third emission areas EA2 and EA3. In addition, the bank 270 also has an auxiliary contact hole 270d between the second emission area EA2 and the second transparent area TA2, more particularly, between the second emission area EA2 and the second portion of the second transparent area TA2. The auxiliary contact hole 270d corresponds to the first auxiliary electrode 214.

The first electrode 260 of the first emission area EA1 is exposed through the first opening 270a, the top surface of the overcoat layer 255 of the first transparent area TA1 is exposed through the second opening 270b, and the first electrode 260 of each of the second and third emission areas EA2 and EA3 is exposed through the third opening 270c. In addition, the connection pattern 262 is exposed through the auxiliary contact hole 270d.

The bank 270 includes a first bank 272 of a hydrophilic property and a second bank 274 of a hydrophobic property.

The first bank 272 is formed between adjacent same color sub-pixels. On the other hand, the second bank 274 is formed between the adjacent different color sub-pixels and exposes the first bank 272 disposed between the adjacent same color sub-pixels. Accordingly, in FIGS. 9 to 11, the second bank 274 is formed between adjacent ones of the first, second, and third emission areas EA1, EA2, and EA3, and the first bank 272 is formed between adjacent third emission areas EA3. The first bank 272 is also formed between adjacent first emission areas EA1 and between adjacent second emission areas EA2.

In addition, the second bank 274 is formed between adjacent first and second transparent areas TA1 and TA2 and between the second transparent area TA2 and the second emission area EA2 adjacent to each other.

Meanwhile, the first bank 272 is also formed in the second transparent area TA2. Moreover, the first bank 272 can be further formed under the second bank 274. Accordingly, the first bank 272 is formed between the adjacent ones of the first, second, and third emission areas EA1, EA2, and EA3 and also formed between the adjacent first and second transparent areas TA1 and TA2 and between the second transparent area TA2 and the second emission area EA2 adjacent to each other.

A light-emitting layer 280 is formed on the first electrode 260 exposed through each of the first and third openings 270a and 270c. The light-emitting layer 280 includes red, green, and blue light-emitting layers 280r, 280g, and 280b corresponding to the first, second, and third emission areas EA1, EA2, and EA3, respectively. The red light-emitting layer 280r is formed in the second transparent area TA2 as well as in the first emission area EA1.

The red, green, and blue light-emitting layers 280r, 280g, and 280b have different thicknesses. For example, the thickness of the green light-emitting layer 280g is smaller than the thickness of the red light-emitting layer 280r and greater than the thickness of the blue light-emitting layer 280b.

Here, the light-emitting layer 280 is also formed on the first bank 272 exposed between the adjacent same color sub-pixels. The light-emitting layer 280 on the first bank 272 is connected to the light-emitting layer 280 on the first electrode 260 adjacent thereto to thereby form one body. For example, as shown in FIG. 11, the blue light-emitting layer 280b is formed on the first bank 272 between the adjacent third emission areas EA3, and the blue light-emitting layer 280b on the first bank 272 is connected to the blue light-emitting layer 280b of the third emission area EA3 adjacent thereto, thereby forming one body.

The light-emitting layer 280 is formed through a solution process. Here, solutions dropped through different nozzles corresponding to the same color sub-pixel row are connected to each other, and the solutions are dried, thereby forming the light-emitting layer 280. Accordingly, the deviation in the dropping amounts between the nozzles is reduced or minimized, so that the thicknesses of thin films formed in respective sub-pixels can be uniformly formed.

At this time, the red light-emitting layer 280r, which is formed in the first emission area EA1 having the narrowest width and has the thickest thickness, is formed in the second transparent area TA2 as well as in the first emission area EA1, so that an area where the solution is dropped can be sufficiently secured. Accordingly, it is possible to prevent the color mixing between the red light-emitting layer 280r and the green light-emitting layer 280g.

Next, the second electrode 290 is formed on the light-emitting layer 280. The first electrode 260, the light-emitting layer 280, and the second electrode 290 constitute a light-emitting diode De.

Here, the second electrode 290 is formed substantially over the entire surface of the substrate 200, more particularly, substantially all over a display area where the plurality of pixels P is provided. Namely, the second electrode 290 is formed in all the first, second, and third emission areas EA1, EA2, and EA3 and the first and second transparent areas TA1 and TA2 and also formed on the bank 270.

The second electrode 290 is electrically connected to the first auxiliary electrode 214 through the auxiliary contact hole 270d. Specifically, the second electrode 290 is electrically connected to the connection pattern 262 through the auxiliary contact hole 270d, and the connection pattern 262 is electrically connected to the first auxiliary electrode 214 through the contact hole 255c. Therefore, the second electrode 290 is electrically connected to the first auxiliary electrode 214 through the connection pattern 262. Here, the second electrode 290 can be in direct contact with the connection pattern 262.

In addition, the second electrode 290 also contacts the overcoat layer 255 exposed through the second opening 270b in the first transparent area TA1.

In the transparent display device 2000 according to the second embodiment of the present disclosure, the first bank 272 and the light-emitting layer 280 are further formed in the second transparent area TA2 compared to the first transparent area TA1. Accordingly, the transmittance of the first transparent area TA1 is higher than the transmittance of the second transparent area TA2.

As described above, in the transparent display device 2000 according to the second embodiment of the present disclosure, one/each pixel P includes the emission area EA and the transparent area TA, so that the surrounding environment information such as backgrounds can be shown through the transparent areas TA while displaying the image information through the emission areas EA.

In addition, in the transparent display device 2000 according to the second embodiment of the present disclosure, by forming at least some of the light-emitting layer 280 through the solution process, a fine metal mask can be omitted to thereby reduce the manufacturing costs, and a display device with a large size and high definition can be implemented.

Further, the transparent display device 2000 according to the second embodiment of the present disclosure is implemented as the top emission type, thereby improving the luminance and reducing the power consumption. Here, since the second electrode 290 is formed to have the relatively thin thickness in order to transmit light, the resistance of the second electrode 290 can be increased, but the resistance of the second electrode 290 can be lowered by electrically connecting the second electrode 290 to the first auxiliary electrode 214 through the connection pattern 262.

Moreover, in the transparent display device 2000 according to the second embodiment of the present disclosure, the light-emitting layers 280 of the same color sub-pixels are connected to each other and formed as one body, thereby reducing or minimizing the deviation in the dropping amounts between the nozzles and uniformly forming the thicknesses of the light-emitting layers 280 of respective sub-pixels.

Additionally, the second transparent area TA2 is provided at both sides of the first emission area EA1 having the smallest size such that the light-emitting layer 280 of the first emission area EA1 having the thickest thickness extends into the second transparent area TA2, thereby preventing the color mixing between the first emission area EA1 and the second emission area EA2.

Further, the first auxiliary electrode 214 is disposed under the first emission area EA1, so that the width of the first auxiliary electrode 214 can be increased, thereby further lowering the resistance of the second electrode 290. In addition, since the size of the auxiliary contact hole 270d can be increased, the contact area between the second electrode 290 and the connection pattern 262 can be increased, and thus the contact property between the second electrode 290 and the connection pattern 262 can be improved.

In the present disclosure, since each pixel includes the emission area and the transparent area, the surrounding environment information such as backgrounds can be shown through the transparent areas while displaying the image information through the emission areas.

In addition, the emission areas of the red, green and blue sub-pixels are configured to have the different sizes, the lifetimes of the light-emitting diodes provided at respective sub-pixels can be uniform, thereby improving the lifetime of the transparent display device.

Moreover, the transparent display device can be implemented as the top emission type to thereby increase the luminance and reduce the power consumption. At this time, the second electrode is electrically connected to the auxiliary electrode through the connection pattern, so that the resistance of the second electrode can be lowered.

Further, by forming at least a part of the light-emitting layer through the solution process, the fine metal mask can be omitted to thereby reduce the manufacturing costs, and a display device with a large size and high definition can be implemented.

Additionally, the second transparent area having the lower transmittance than the first transparent area is provided at both sides of the first emission area which has the smallest size and in which the light-emitting layer with the thickest thickness is formed, so that the light-emitting layer extends into the second transparent area, thereby preventing the color mixing between the first and second emission areas adjacent to each other.

Moreover, the auxiliary electrode is disposed between the second transparent area and the second emission area, so that the color mixing can be further prevented between the first and second emission areas adjacent to each other.

Alternatively, the auxiliary electrode is disposed under the first emission area, so that the width of the auxiliary electrode increase, thereby further lowering the resistance of the second electrode.

It will be apparent to those skilled in the art that various modifications and variations can be made in a device of the present disclosure without departing from the sprit or scope of the embodiments. Thus, it is intended that the present disclosure covers the modifications and variations of this invention provided they come within the scope of the appended claims and their equivalents.

What is claimed is:

1. A transparent display device comprising:
    a substrate on which a pixel including first, second, and third emission areas and first and second transparent areas arranged along a first direction is defined;
    a light-emitting diode disposed in each of the first, second, and third emission areas, and including a first electrode, a light-emitting layer, and a second electrode; and
    an auxiliary electrode extending in a second direction substantially perpendicular to the first direction, and electrically connected to the second electrode,
    wherein the first emission area and the auxiliary electrode are disposed between the first transparent area and the second transparent area, and the second transparent area includes a first portion between the first emission area and the second emission area, and
    wherein the first transparent area has a higher transmittance than the second transparent area.

2. The transparent display device of claim 1, wherein the light-emitting layer in the first emission area extends into the second transparent area.

3. The transparent display device of claim 1, wherein the auxiliary electrode is disposed between the second transparent area and the second emission area.

4. The transparent display device of claim 1, wherein the second emission area has a size larger than the first emission area and smaller than the third emission area.

5. The transparent display device of claim 1, wherein the second transparent area further includes a second portion between the first emission area and the first transparent area.

6. The transparent display device of claim 5, wherein a length of the second portion is longer than a length of the first portion along the second direction.

7. The transparent display device of claim 1, further comprising a bank having a first opening, a second opening, a third opening, and an auxiliary contact hole,
    wherein the first opening corresponds to the first emission area and the second transparent area, the second opening corresponds to the first transparent area, the third opening corresponds to each of the second and third emission areas, and the auxiliary contact hole corresponds to the auxiliary electrode.

8. The transparent display device of claim 7, wherein the bank includes a first bank of a hydrophilic property and a second bank of a hydrophobic property.

9. The transparent display device of claim 8, wherein the first bank and the second bank are formed as one body.

10. The transparent display device of claim 7, wherein the light-emitting layers of adjacent emission areas along the second direction are connected to each other to form one body.

11. The transparent display device of claim 1, further comprising at least one thin film transistor between the substrate and the first electrode,
    wherein the first electrode is connected to the at least one thin film transistor.

12. The transparent display device of claim 1, further comprising a connection pattern formed of a same material and disposed on a same layer as the first electrode,
    wherein the second electrode is electrically connected to the auxiliary electrode through the connection pattern.

13. The transparent display device of claim 1, wherein the auxiliary electrode overlaps the first emission area.

14. The transparent display device of claim 13, further comprising at least one thin film transistor between the substrate and the first electrode,
    wherein the at least one thin film transistor is connected to the first electrode in the first emission area, and is disposed in the second emission area or the third emission area.

15. The transparent display device of claim 8, wherein the first bank is disposed between adjacent same color sub-pixels along the second direction, and the second bank is disposed between adjacent different color sub-pixels.

* * * * *